United States Patent
Seshita et al.

(10) Patent No.: US 10,411,658 B2
(45) Date of Patent: Sep. 10, 2019

(54) SEMICONDUCTOR DEVICE

(71) Applicants: Kabushiki Kaisha Toshiba, Minato-ku, Tokyo (JP); Toshiba Electronic Devices & Storage Corporation, Minato-ku, Tokyo (JP)

(72) Inventors: Toshiki Seshita, Kawasaki Kanagawa (JP); Yasuhiko Kuriyama, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 15/842,255

(22) Filed: Dec. 14, 2017

(65) Prior Publication Data

US 2018/0167039 A1 Jun. 14, 2018

(30) Foreign Application Priority Data

Dec. 14, 2016 (JP) .................. 2016-242603
Aug. 21, 2017 (JP) .................. 2017-158851

(51) Int. Cl.
*H03F 3/04* (2006.01)
*H03F 3/16* (2006.01)
(Continued)

(52) U.S. Cl.
CPC .............. *H03F 3/16* (2013.01); *H03F 1/223* (2013.01); *H03F 1/523* (2013.01); *H03F 3/193* (2013.01);
(Continued)

(58) Field of Classification Search
CPC . H03F 3/16; H03F 3/193; H03F 1/223; H03F 3/211; H03F 3/68; H03F 1/523
(Continued)

(56) References Cited

U.S. PATENT DOCUMENTS 5,722,063 A 2/1998 Peterzell et al.
6,366,788 B1 * 4/2002 Fujioka .................. H03F 3/193
330/51

(Continued)

FOREIGN PATENT DOCUMENTS

JP 2004-516653 A 6/2004
JP 2006-521060 A 9/2006
(Continued)

*Primary Examiner* — Khanh V Nguyen
*Assistant Examiner* — Khiem D Nguyen
(74) *Attorney, Agent, or Firm* — White & Case LLP

(57) ABSTRACT

An amplifier amplifies an input signal. A splitter branches an output signal of the amplifier into a first signal path and a second signal path and performs impedance conversion of the first and second signal paths. A first output terminal outputs the output signal of the amplifier or a signal obtained by branching the output signal of the amplifier into the first signal path by the splitter. A second output terminal outputs the output signal of the amplifier or a signal obtained by branching the output signal of the amplifier into the second signal path by the splitter. An output controller switches whether the output signal of the amplifier is output from the first output terminal, is output from the second output terminal, or is branched by the splitter to be output from both the first and second output terminals.

16 Claims, 22 Drawing Sheets

(51) Int. Cl.
*H03F 1/52* (2006.01)
*H03F 1/22* (2006.01)
*H03F 3/193* (2006.01)
*H03F 3/21* (2006.01)
*H03F 3/68* (2006.01)

(52) U.S. Cl.
CPC ............... *H03F 3/211* (2013.01); *H03F 3/68* (2013.01); *H03F 2200/111* (2013.01); *H03F 2200/294* (2013.01); *H03F 2200/421* (2013.01); *H03F 2200/451* (2013.01); *H03F 2200/75* (2013.01); *H03F 2200/81* (2013.01)

(58) Field of Classification Search
USPC ................. 330/295, 124 R, 51, 302, 310
See application file for complete search history.

(56) References Cited

U.S. PATENT DOCUMENTS

| | | |
|---|---|---|
| 6,588,217 B2 | 7/2003 | Ghoshal |
| 6,954,623 B2 | 10/2005 | Chang et al. |
| 7,629,853 B2 | 12/2009 | Oishi |
| 8,060,041 B2 | 11/2011 | Ballantyne |
| 8,102,205 B2 | 1/2012 | Pletcher et al. |
| 8,903,343 B2 | 12/2014 | Holenstein et al. |
| 8,913,976 B2 | 12/2014 | Khatri et al. |
| 8,922,268 B2 | 12/2014 | Madan et al. |
| 8,970,516 B2 | 3/2015 | Black et al. |
| 9,055,144 B2 | 6/2015 | Yang et al. |
| 9,083,402 B2 | 7/2015 | Asano et al. |
| 9,154,356 B2 | 10/2015 | Tasic et al. |
| 9,178,669 B2 | 11/2015 | Fernando |
| 2013/0003783 A1 | 1/2013 | Gudem et al. |
| 2013/0015924 A1* | 1/2013 | Andre .................. H01L 23/642 333/32 |

FOREIGN PATENT DOCUMENTS

| | | |
|---|---|---|
| JP | 2009-27319 A | 2/2009 |
| JP | 2009-105810 A | 5/2009 |
| JP | 2009-159411 A | 7/2009 |
| JP | 2011-211731 A | 10/2011 |
| JP | 2012-19307 A | 1/2012 |
| JP | 2012-170121 A | 9/2012 |
| JP | 5032505 B2 | 9/2012 |
| JP | 2013-501470 A | 1/2013 |
| JP | 2013-538010 A | 10/2013 |
| JP | 2013-239775 A | 11/2013 |
| JP | 5512740 B2 | 6/2014 |
| JP | 2014-526173 A | 10/2014 |
| JP | 2014-239349 A | 12/2014 |
| JP | 2015-521010 A | 7/2015 |
| JP | 2015-523810 A | 8/2015 |
| JP | 5893806 B2 | 3/2016 |
| JP | 5902294 B2 | 4/2016 |
| JP | 2016-92826 A | 5/2016 |
| WO | 2002-049105 A2 | 6/2002 |
| WO | 2007-092921 A1 | 8/2007 |
| WO | 2012-040063 A1 | 3/2012 |
| WO | 2013-177563 A1 | 11/2013 |
| WO | 2014-116674 A1 | 7/2014 |

* cited by examiner

| MODE | ACTIVE OUTPUT | Cont1 | Cont2 | Cont3 |
|---|---|---|---|---|
| SINGLE OUTPUT MODE | RF1out | L | H | L |
| | RF2out | L | L | H |
| SPLIT MODE | RF1out, RF2out | H | L | L |

| MODE | ACTIVE INPUT | ACTIVE OUTPUT | SW1 | SW2 | SW3 | SW4 | SW5 | SW6 | SW7 | SW8 | SW9 | SW10 |
|---|---|---|---|---|---|---|---|---|---|---|---|---|
| SINGLE OUTPUT MODE | RFin1 | RFout1 | OFF | OFF | OFF | ON | OFF | OFF | OFF | OFF | ON | OFF |
| | | RFout2 | OFF | OFF | OFF | OFF | ON | OFF | OFF | OFF | ON | OFF |
| | RFin2 | RFout1 | OFF | OFF | OFF | OFF | OFF | OFF | ON | OFF | OFF | ON |
| | | RFout2 | OFF | OFF | OFF | OFF | OFF | OFF | OFF | ON | OFF | ON |
| LNA-1,2 SIMULTANEOUS OPERATION MODE | RFin1 to RFout1, RFin2 to RFout2 | | OFF | OFF | OFF | ON | OFF | OFF | OFF | ON | ON | ON |
| | RFin1 to RFout2, RFin2 to RFout1 | | OFF | OFF | OFF | OFF | ON | OFF | ON | OFF | ON | ON |
| SPLIT MODE | RFin1 | RFout1, RFout2 | ON | ON | ON | OFF | OFF | ON | OFF | OFF | ON | OFF |
| | RFin2 | RFout1, RFout2 | OFF | ON | ON | OFF | OFF | ON | OFF | OFF | OFF | ON |

FIG. 5

| MODE | ACTIVE INPUT | ACTIVE OUTPUT | SW1 | SW2 | SW3 | SW4 | SW5 | SW6 | SW7 | SW8 | SW9 | SW10 | SW11 | SW12 |
|---|---|---|---|---|---|---|---|---|---|---|---|---|---|---|
| SINGLE OUTPUT MODE | RFin1 | RFout1 | OFF | OFF | OFF | ON | OFF | OFF | OFF | OFF | ON | OFF | OFF | OFF |
| | | RFout2 | OFF | OFF | OFF | OFF | ON | OFF | OFF | OFF | OFF | OFF | OFF | OFF |
| | RFin2 | RFout1 | OFF | OFF | OFF | OFF | OFF | OFF | ON | OFF | OFF | ON | OFF | OFF |
| | | RFout2 | OFF | OFF | OFF | OFF | OFF | OFF | OFF | ON | OFF | ON | OFF | OFF |
| | RFin3 | RFout1 | OFF | OFF | OFF | OFF | OFF | OFF | OFF | OFF | OFF | OFF | ON | OFF |
| | | RFout2 | OFF | OFF | OFF | OFF | OFF | OFF | OFF | OFF | OFF | OFF | OFF | ON |
| LNA-1,2 SIMULTANEOUS OPERATION MODE | RFin1 to RFout1, RFin2 to RFout2 | | OFF | OFF | OFF | ON | OFF | OFF | OFF | ON | ON | ON | OFF | OFF |
| | RFin1 to RFout2, RFin2 to RFout1 | | OFF | OFF | OFF | OFF | ON | OFF | ON | OFF | ON | ON | OFF | OFF |
| LNA-1,3 SIMULTANEOUS OPERATION MODE | RFin1 to RFout1, RFin3 to RFout2 | | OFF | OFF | OFF | ON | OFF | OFF | OFF | OFF | ON | OFF | OFF | ON |
| | RFin1 to RFout2, RFin3 to RFout1 | | OFF | OFF | OFF | OFF | ON | OFF | OFF | OFF | ON | OFF | ON | OFF |
| LNA-2,3 SIMULTANEOUS OPERATION MODE | RFin2 to RFout1, RFin3 to RFout2 | | OFF | OFF | OFF | OFF | OFF | OFF | ON | OFF | OFF | ON | OFF | ON |
| | RFin2 to RFout2, RFin3 to RFout1 | | OFF | OFF | OFF | OFF | OFF | OFF | OFF | ON | OFF | ON | ON | OFF |
| SPLIT MODE | RFin1 | RFout1, RFout2 | ON | ON | ON | OFF | OFF | ON | OFF | OFF | ON | OFF | OFF | OFF |
| | RFin2 | RFout1, RFout2 | OFF | ON | ON | OFF | OFF | ON | OFF | OFF | ON | OFF | OFF | OFF |

FIG. 7

| | Band-L | Band-H |
|---|---|---|
| Cont4 | High | Low |
| Cont5 | High | Low |

| BIAS CONTROL SIGNAL NAME | SINGLE OUTPUT MODE | SPLIT MODE |
|---|---|---|
| VB1 | VB1_single | VB1_split |
| VB2 | VB2_single | VB2_split |
| Cont6 | High | Low |

VB1_single < VB1_split
VB2_single < VB2_split

| BAND NAME | fmin (MHz) | fcenter (MHz) | fmax (MHz) | LNA OUTPUT MODE | Idd (mA) | S21(dB) fmin | S21(dB) fcenter | S21(dB) fmax | S11(dB) fmin | S11(dB) fcenter | S11(dB) fmax | S22(dB) fmin | S22(dB) fcenter | S22(dB) fmax | S23(dB) fmin | S23(dB) fcenter | S23(dB) fmax | Ip1dB (dBm) fcenter |
|---|---|---|---|---|---|---|---|---|---|---|---|---|---|---|---|---|---|---|
| Band-L | 1805 | 1915 | 2025 | SINGLE | 6.2 | 18.7 | 18.5 | 17.7 | -10.1 | -11.2 | -8.9 | -13.0 | -13.2 | -10.6 | - | - | - | -16.0 |
| | | | | SPLIT | 12.4 | 18.2 | 17.6 | 16.6 | -13.5 | -18.2 | -13.0 | -18.1 | -15.8 | -14.6 | -20.6 | -29.3 | -20.6 | -15.5 |
| Band-H | 2110 | 2155 | 2200 | SINGLE | 6.2 | 18.6 | 18.4 | 18.2 | -8.3 | -8.6 | -8.7 | -17.4 | -15.7 | -13.9 | - | - | - | -15.4 |
| | | | | SPLIT | 12.4 | 17.8 | 17.5 | 17.2 | -13.6 | -14.1 | -13.9 | -14.0 | -13.9 | -13.9 | -26.0 | -30.3 | -25.9 | -14.2 |

FIG. 21

| ELEMENT NAME | COMPARATIVE EXAMPLE | EXAMPLE |
|---|---|---|
| L1a, L1b | 4.65nH | 3.08nH |
| L2a, L2b | 4.63nH | 3.74nH |
| C_1a, C_1b | 0.888pF | 0.87pF |
| R | 100Ω | 120Ω |
| R_2 | - | 44.5Ω |
| C_2a, C_2b | - | 0.2pF |

|  | EXAMPLE | COMPARATIVE EXAMPLE |
| --- | --- | --- |
| S21 (dB) | -3.503 | -3.604 |
| S11 (dB) | -22.446 | -20.023 |
| S22 (dB) | -24.678 | -27.153 |
| S23 (dB) | -26.010 | -22.191 |

SEMICONDUCTOR DEVICE

CROSS REFERENCE TO RELATED APPLICATIONS

This application is based upon and claims the benefit of priority from the prior Japanese Patent Applications No. 2016-242603, filed on Dec. 14, 2016 and No. 2017-158851, filed on Aug. 21, 2017, the entire contents of which are incorporated herein by reference.

FIELD

The embodiments of the present invention relate to a semiconductor device.

BACKGROUND

A high-frequency low-noise amplifier mounted on a mobile phone terminal and the like is conventionally manufactured by a SiGe (Silicon-Germanium) bipolar process. In recent years, however, the SiGe bipolar process is being replaced by an SOI (Silicon On Insulator) CMOS (Complementary Metal-Oxide Semiconductor) process. One reason thereof is that the SOI CMOS process enables a high-frequency low-noise amplifier to be formed with a high-frequency switch and a complicated control circuit on a same SOI substrate.

Furthermore, to address advanced communication such as carrier aggregation, a complicated function to operate in a plurality of operation modes such as simultaneous reception or selective reception of signals in different frequency bands or reception of different signals in a same frequency band is recently demanded of a high-frequency low-noise amplifier.

However, conventionally, there is no effective proposal regarding a technique in a high-frequency low-noise amplifier to address advanced communication.

BRIEF DESCRIPTION OF THE DRAWINGS

FIG. 5 is a diagram illustrating a truth table of the high-frequency semiconductor device according to the second embodiment;

FIG. 7 is a diagram illustrating a truth table of the high-frequency semiconductor device according to the third embodiment;

FIG. 21 is a diagram illustrating a list of representative values in the graphs of FIGS. 17 to 20 in the simulation example of the high-frequency semiconductor device according to the sixth embodiment;

DETAILED DESCRIPTION

Figure 1:
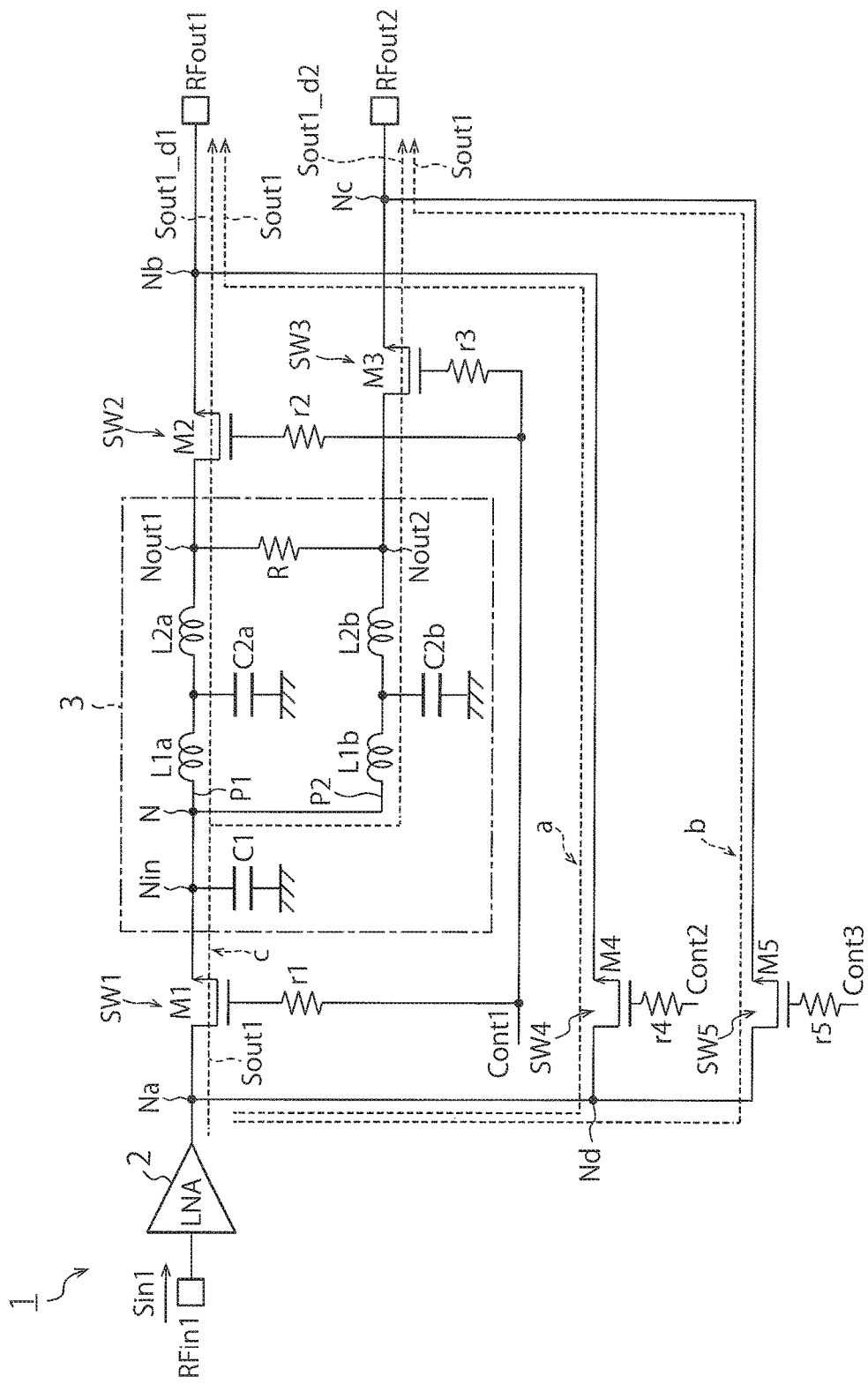
FIG. 1 is a circuit diagram of a high-frequency semiconductor device according to a first embodiment.

A semiconductor device according to embodiments of the present invention includes an amplifier, a splitter, a first output terminal, a second output terminal, an output controller, and an SOI substrate. The amplifier amplifies an input signal. The splitter branches an output signal of the amplifier into a first signal path and a second signal path and performs impedance conversion of the first and second signal paths. The first output terminal outputs the output signal of the amplifier or a signal obtained by branching the output signal of the amplifier into the first signal path by the splitter. The second output terminal outputs the output signal of the amplifier or a signal obtained by branching the output signal of the amplifier into the second signal path by the splitter. The output controller switches whether the output signal of the amplifier is output from the first output terminal, is output from the second output terminal, or is branched by the splitter to be output from both the first and second output terminals. The SOI substrate has the amplifier, the splitter, and the output controller placed thereon.

Embodiments of the present invention will now be explained with reference to the accompanying drawings. In the following embodiments, although characteristic configurations and operations of a semiconductor device are mainly explained, other configurations and operations that are omitted from the following explanations may also exist in the semiconductor device. Such omitted configurations and operations are also included in the scope of the embodiments. Further, in the drawings referred to in the embodiments, like parts or parts having identical functions are denoted by like or similar reference characters, and redundant explanations thereof will be omitted.

(First Embodiment)

FIG. 1 is a circuit diagram of a high-frequency semiconductor device 1 according to a first embodiment, which is an example of a semiconductor device. The high-frequency semiconductor device 1 illustrated in FIG. 1 is applicable to a mobile phone terminal, for example.

The high-frequency semiconductor device 1 illustrated in FIG. 1 is manufactured on a common SOI substrate by a CMOS process. As illustrated in FIG. 1, the high-frequency semiconductor device 1 includes an SOI substrate, a first high-frequency LNA (Low Noise Amplifier) 2 being an example of a first amplifier, a splitter 3, a first output terminal RFout1, a second output terminal RFout2, and first to fifth switches SW1 to SW5 being an example of an output controller.

The first high-frequency LNA 2 amplifies a first high-frequency input signal Sin1 being an example of a first input signal and outputs a first high-frequency output signal Sout1 being an example of an output signal of the first amplifier.

As illustrated in FIG. 1, the first high-frequency LNA 2 is placed on the SOI substrate and has one end connected to a first input terminal RFin1 and the other end connected to the first output terminal RFout1 and the second output terminal RFout2 via a branch node N in the splitter 3.

Figures 2, 3:
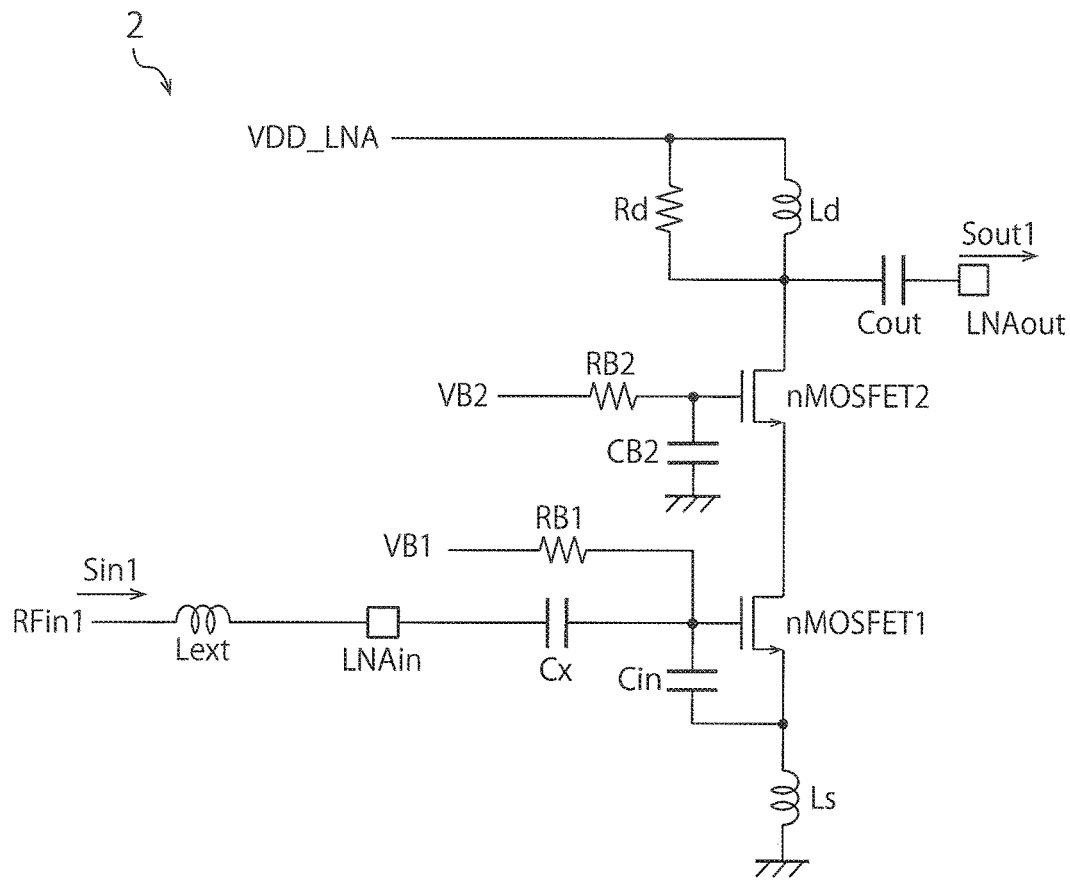
FIG. 2 is a circuit diagram illustrating a first high-frequency LNA in the high-frequency semiconductor device according to the first embodiment.
FIG. 3 is a diagram illustrating a truth table of the high-frequency semiconductor device according to the first embodiment.

FIG. 2 is a circuit diagram illustrating the first high-frequency LNA 2 in the high-frequency semiconductor device 1 according to the first embodiment. As illustrated in FIG. 2, the first high-frequency LNA 2 is a cascode high-frequency LNA.

As illustrated in FIG. 2, the first high-frequency LNA 2 includes a spiral inductor Ls being an example of a fifth inductor, an nMOSFET 1 being an example of a first transistor, an nMOSFET 2 being an example of a second transistor, and an inductor Ld being an example of a sixth inductor. The nMOSFETs are MOSFETs (Metal-Oxide-Semiconductor Field-Effect Transistor) having an n-type conductivity (the same holds true for other nMOSFETs). The spiral inductor Ls, the nMOSFET 1, the nMOSFET 2, and the inductor Ld are connected in series between a ground potential being an example of a first reference potential and a power-supply potential VDD_LNA being an example of a second reference potential. In addition thereto, the first high-frequency LNA 2 also includes a plurality of resistors RB1, RB2, and Rd, and a plurality of capacitors Cx, Cin, and Cout.

A gate of the nMOSFET 1 is connected to the first input terminal RFin1 via the capacitor Cx, an input terminal LNAin, and an external inductor Lext. That is, the external inductor Lext and the capacitor Cx are connected in series between the first input terminal RFin1 and the gate of the nMOSFET 1. In FIG. 1, illustrations of the external inductor Lext are omitted. A bias-voltage generation circuit (not illustrated) is connected to the gate of the nMOSFET 1 via the resistor RB1.

The nMOSFET 2 is cascode-connected to the nMOSFET 1. A drain of the nMOSFET 2 is connected to an output terminal LNAout of the first high-frequency LNA 2 via the capacitor Cout. A gate of the nMOSFET 2 is connected to the bias-voltage generation circuit (not illustrated) via the resistor RB2. The gate of the nMOSFET 2 is grounded via a capacitor CB2 being an earth capacitor.

The spiral inductor Ls has one end connected to a source of the nMOSFET 1 and the other end connected to the ground potential. That is, the nMOSFET 1 is a source grounded FET having inductive source degeneration due to the spiral inductor Ls. One end of the capacitor Cin is connected between the spiral inductor Ls and the source of the nMOSFET 1. The other end of the capacitor Cin is connected to the gate of the nMOSFET 1.

The inductor Ld has one end connected to the drain of the nMOSFET 2 and the other end connected to the power-supply potential VDD_LNA. The power-supply potential VDD_LNA is generated by the bias-voltage generation circuit (not illustrated). The resistor Rd is connected in parallel with the inductor Ld.

In the first high-frequency LNA 2 configured as illustrated in FIG. 2, the nMOSFET 1 is turned on by input of a bias voltage VB1. The nMOSFET 2 is turned on by application of a bias voltage VB2. In an on-state, a drain current due to the power-supply potential VDD_LNA flows through the nMOSFET 1 and the nMOSFET 2. When the first high-frequency input signal Sin1 is input from the first input terminal RFin to the gate of the nMOSFET 1 in a state where the drain current is flowing through the nMOSFET 1 and the nMOSFET 2, the first high-frequency output signal Sout1 obtained by amplifying the first high-frequency input signal Sin1 is output as a signal corresponding to a drain voltage of the nMOSFET 2 from the output terminal LNAout of the first high-frequency LNA 2.

The first high-frequency input signal Sin1 is, for example, a signal belonging to a frequency band of 1.8 to 2.0 GHz or a frequency band of 2.0 to 2.2 GHz. The first high-frequency input signal Sin1 may include a plurality of high-frequency signals having different frequencies in a same frequency band (1.8 to 2.0 GHz or 2.0 to 2.2 GHz, for example). These high-frequency signals having different frequencies in a same frequency band can be demodulated individually by demodulators (not illustrated) after passing through the first high-frequency LNA 2 and the splitter 3.

At the time of amplification of the first high-frequency input signal Sin1 by the first high-frequency LNA 2, the external inductor Lext, the capacitor Cin, and the spiral inductor Ls function as an input matching element and perform desired impedance matching in consideration of gain matching and noise matching of the FET 1 and the FET 2 for amplification. The capacitor Cx eliminates DC components of the first high-frequency input signal Sin1. The inductor Ld and the capacitor Cout function as an output matching circuit that performs impedance matching on an output side. The resistor Rd stabilizes frequency characteristics of a signal from steep ones to flat ones to enable handling of a wide band. The resistors RB1 and RB2 prevent the first high-frequency input signal Sin1 from being transmitted to the side of the bias-voltage generation circuit.

The splitter 3 branches the first high-frequency output signal Sout1 being an output signal of the first high-frequency LNA 2 into a first signal path P1 and a second signal path P2 and performs impedance conversion of the first and second signal paths P1 and P2 and isolation between the first and second signal paths P1 and P2.

The splitter 3 includes a plurality of lumped parameter elements arranged on the SOI substrate. Specifically, as illustrated in FIG. 1, the splitter 3 includes a first spiral inductor L1a being an example of a first inductor, a second spiral inductor L2a being an example of a second inductor, a third spiral inductor L1b being an example of a third inductor, a fourth spiral inductor L2b being an example of a fourth inductor, a first capacitor C1, a second capacitor C2a, a third capacitor C2b, and a resistor R.

The lumped parameter elements L1a, L2a, L1b, L2b, C1, C2a, C2b, and R are connected between an input node Nin between an output node Na of the first high-frequency LNA 2 and the branch node N, and a first output node Nout1 between the branch node N and the first output terminal RFout1, or between the branch node N, and a second output node Nout2 between the branch node N and the second output terminal RFout2.

Specifically, the first capacitor C1 is connected between the input node Nin of the splitter 3 and the ground potential being an example of a reference potential. The first spiral inductor L1a and the second spiral inductor L2a are connected in series on the first signal path P1, that is, between the branch node N and the first output node Nout1. The third spiral inductor L1b and the fourth spiral inductor L2b are connected in series on the second signal path P2, that is, between the branch node N and the second output node Nout2. One end of the second capacitor C2a is connected between the first spiral inductor L1a and the second spiral inductor L2a, and the other end thereof is connected to the ground potential being an example of a reference potential. One end of the third capacitor C2b is connected between the third spiral inductor L1b and the fourth spiral inductor L2b and the other end thereof is connected to the ground potential being an example of a reference potential. The resistor R is connected between the first output node Nout1 and the second output node Nout2.

The first to fourth spiral inductors L1a, L2a, L1b, and L2b are spiral conductive patterns. The first spiral inductor L1a and the third spiral inductor L1b have a same inductance. The second spiral inductor L2a and the fourth spiral inductor L2b have a same inductance. The second capacitor C2a and the third capacitor C2b have a same capacitance. The resistor R has a resistance value twice as large as the characteristic impedance of the splitter 3. For example, when the characteristic impedance is 50 Ω, the resistance value of the resistor R is 100 Ω.

The splitter 3 having the above configuration branches the first high-frequency output signal Sout1 input to the input node Nin into the first signal path P1 and the second signal path P2 at the branch node N. A signal (hereinafter, also "first high-frequency first branch signal Sout1_d1") obtained by branching the first high-frequency output signal Sout1 into the first signal path P1 using the splitter 3 and a signal (hereinafter, also "first high-frequency second branch signal Sout1_d2") obtained by branching the first high-frequency output signal Sout1 into the second signal path P2 using the splitter 3 are signals obtained by distributing the first high-frequency output signal Sout1 into two. Therefore, power of the first high-frequency first branch signal Sout1_d1 and the first high-frequency second branch signal Sout1_d2 is attenuated at least by half (that is, 3 dB) from that of the first high-frequency output signal Sout1.

The first high-frequency first branch signal Sout1_d1 passes through the first output node Nout1 and is output from the first output terminal RFout1 to a first demodulator (not illustrated). The first high-frequency second branch signal Sout1_d2 passes through the second output node Nout2 and is output from the second output terminal RFout2 to a second demodulator (not illustrated). The first high-frequency first branch signal Sout1_d1 and the first high-frequency second branch signal Sout1_d2 are signals belonging to the same frequency band (1.8 to 2.0 GHz or 2.0 to 2.2 GHz, for example) as that of the first high-frequency input signal Sin1 and each include a plurality of high-frequency signals having different frequencies in the frequency band. The first demodulator demodulates a high-frequency signal of a preset first frequency among the high-frequency signals included in the first high-frequency first branch signal Sout1_d1. A second demodulator demodulates a high-frequency signal of a preset second frequency different from the first frequency among the high-frequency signals included in the first high-frequency second branch signal Sout1_d2. In this way, two high-frequency signals having different frequencies in the same frequency band can be received from the first high-frequency first branch signal Sout1_d1 and the first high-frequency second branch signal Sout1_d2 output through the splitter 3.

In the splitter 3, the first signal path P1 and the second signal path P2 function as an impedance converter that converts the impedance to 2:1. Accordingly, an impedance at a time when the inside of the splitter 3 is seen from the input node Nin, an impedance at a time when the inside of the splitter 3 is seen from the first output node Nout1, and an impedance at a time when the inside of the splitter 3 is seen from the second output node Nout2 all become the characteristic impedance (50 Ω, for example). That is, desired impedance matching can be realized in the splitter 3. Furthermore, because the splitter 3 includes the spiral inductors L1a, L2a, L1b, and L2b that can have a long line length in a relatively small area, the splitter 3 can perform the impedance matching appropriately while having a compact configuration.

A path from the first output node Nout1 to the second output node Nout2 through the branch node N and a path from the second output node Nout2 to the first output node Nout1 through the branch node N function as phase shifters that rotate a phase by 180°, respectively. Therefore, isolation between the first output node Nout1 and the second output node Nout2 can be reliably achieved as isolation between the first signal path P1 and the second signal path P2.

The first to fifth switches SW1 to SW5 switch whether the first high-frequency output signal Sout1 is output from the first output terminal RFout1, is output from the second output terminal FRout2, or is branched by the splitter 3 to be output from both the first and second output terminals RFout1 and RFout2, by switching control thereof. When the first high-frequency output signal Sout1 is branched by the splitter 3, the first high-frequency output signal Sout1 is output from the first and second output terminals RFout1 and RFout2 in the state of the first high-frequency first branch signal Sout1_d1 and the first high-frequency second branch signal Sout1_d2, respectively.

The first switch SW1 includes an nMOSFET M1 and a resistor r1. The nMOSFET M1 is connected between the output node Na of the first high-frequency LNA 2 and the input node Nin of the splitter 3. The resistor r1 is connected to a gate of the nMOSFET M1. The resistor r1 has a high resistance value such as 100 kΩ. The first switch SW1 is controlled to be on/off by a first control signal Cont1 input to the gate of the nMOSFET M1 via the resistor r1. A generation circuit that generates control signals for the nMOSFET M1 and nMOSFETs M2 to M5 is not illustrated. The generation circuit for the control signals is placed, for example, on the SOI substrate. The generation circuit for the control signals can be placed outside the high-frequency semiconductor device 1.

The second switch SW2 includes the nMOSFET M2 and a resistor r2. The nMOSFET M2 is connected between the first output node Nout1, that is, the first signal path P1 and the first output terminal RFout1. The resistor r2 has a high resistance value such as 100 kΩ and is connected to a gate of the nMOSFET M2. The second switch SW2 is controlled to be on/off by the first control signal Cont1 input to the gate of the nMOSFET M2 via the resistor r2.

The third switch SW3 includes the nMOSFET M3 and a resistor r3. The nMOSFET M3 is connected between the second output node Nout2, that is, the second signal path P2 and the second output terminal RFout2. The resistor r3 has a high resistance value such as 100 kΩ and is connected to a gate of the nMOSFET M3. The third switch SW3 is controlled to be on/off by the first control signal Cont1 input to the gate of the nMOSFET M3 via the resistor r3.

The fourth switch SW4 includes the nMOSFET M4 and a resistor r4. The nMOSFET M4 is connected between the output node Na of the first high-frequency LNA 2 and the first output terminal RFout1. More specifically, the nMOSFET M4 is connected between the output node Na and a node Nb between the nMOSFET M2 and the first output terminal RFout1. The resistor r4 has a high resistance value such as 100 kΩ and is connected to a gate of the nMOSFET M4. The fourth switch SW4 is controlled to be on/off by a second control signal Cont2 input to the gate of the nMOSFET M4 via the resistor r4.

The fifth switch SW5 includes the nMOSFET M5 and a resistor r5. The nMOSFET M5 is connected between the output node Na of the first high-frequency LNA 2 and the second output terminal RFout2. More specifically, the nMOSFET M5 is connected between a node Nd between the output node Na and the nMOSFET M4, and a node Nc between the nMOSFET M3 and the second output terminal RFout2. The resistor r5 has a high resistance value such as 100 kΩ and is connected to a gate of the nMOSFET M5. The fifth switch SW5 is controlled to be on/off by a third control signal Cont3 input to the gate of the nMOSFET M5 via the resistor r5.

While the number of each of the nMOSFETs M1 to M5 arranged in the example illustrated in FIG. 1 is one, two or more stages of each of the nMOSFETs M1 to M5 can be connected in series.

In the first to fifth switches SW1 to SW5 having the above configuration, the switches SW1 to SW3 are turned on when the switches SW4 and SW5 are turned off, whereby the first high-frequency first branch signal Sout1_d1 and the first high-frequency second branch signal Sout1_d2 obtained by branching the first high-frequency output signal Sout1 by the splitter 3 are output from the first and second output terminals RFout1 and RFout2, respectively. The switch SW4 is turned on when the switches SW1 to SW3 and SW5 are turned off, whereby the first high-frequency output signal Sout1 is output from the first output terminal RFout1. The switch SW5 is turned on when the switches SW1 to SW4 are turned off, whereby the first high-frequency output signal Sout1 is output from the second output terminal RFout2.

(Operation Mode)

FIG. 3 is a diagram illustrating a truth table of the high-frequency semiconductor device 1 according to the first embodiment. The high-frequency semiconductor device 1 having the above configuration according to the first embodiment can operate in two operation modes including a single output mode and a split mode as illustrated in the truth table of FIG. 3.

The single output mode is an operation mode of outputting the first high-frequency output signal Sout1 output from the first high-frequency LNA 2 from the first output terminal RFout1 or the second output terminal RFout2.

When the first output terminal RFout1 is to be activated in the single output mode, the first control signal Cont1 is set to a low level (L), the second control signal Cont2 is set to a high level (H), and the third control signal Cont3 is set to a low level (L) as illustrated in FIG. 3. This turns off the switches SW1 to SW3 and SW5 and turns on the switch SW4. By this on/off control, the first high-frequency output signal Sout1 passes through a signal path a in FIG. 1 via the switch SW4 and is output from the first output terminal RFout1. The first high-frequency output signal Sout1 output from the first output terminal RFout1 is demodulated by the first demodulator (not illustrated).

When the second output terminal RFout2 is to be activated in the single output mode, the first control signal Cont1 is set to a low level, the second control signal Cont2 is set to a low level, and the third control signal Cont3 is set to a high level as illustrated in FIG. 3. This turns off the switches SW1 to SW4 and turns on the switch SW5. By this on/off control, the first high-frequency output signal Sout1 passes through a signal path b in FIG. 1 via the switch SW5 and is output from the second output terminal RFout2. The first high-frequency output signal Sout1 output from the second output terminal RFout2 is demodulated by the second demodulator (not illustrated).

The split mode is an operation mode of branching the first high-frequency output signal Sout1 output from the first high-frequency LNA 2 by the splitter 3 to be output from the first output terminal RFout1 and the second output terminal RFout2. In the split mode, the first control signal Cont1 is set to a high level, the second control signal Cont2 is set to a low level, and the third control signal Cont3 is set to a low level as illustrated in FIG. 3. This turns on the switches SW1 to SW3 and turns off the switches SW4 and SW5. By this on/off control, the first high-frequency output signal Sout1 output from the first high-frequency LNA 2 passes through a signal path c and the signal paths P1 and P2 via the splitter 3 in FIG. 1 and is output from the first output terminal RFout1 and the second output terminal RFout2. That is, the first high-frequency first branch signal Sout1_d1 of the first high-frequency output signal Sout1 split into two by the splitter 3 passes through the first signal path P1 and is output from the first output terminal RFout1 while the first high-frequency second branch signal Sout1_d2 passes through the second signal path P2 and is output from the second output terminal RFout2. The first high-frequency first branch signal Sout1_d1 output from the first output terminal RFout1 is demodulated by the first demodulator (not illustrated), and the first high-frequency second branch signal Sout1_d2 output from the second output terminal RFout2 is demodulated by the second demodulator (not illustrated).

According to the first embodiment, the two operation modes including the single output mode and the split mode can be realized for the first high-frequency output signal Sout1 output from the first high-frequency LNA 2. Therefore, advanced communication can be achieved using the first high-frequency LNA 2.

(Second Embodiment)

Figure 4:
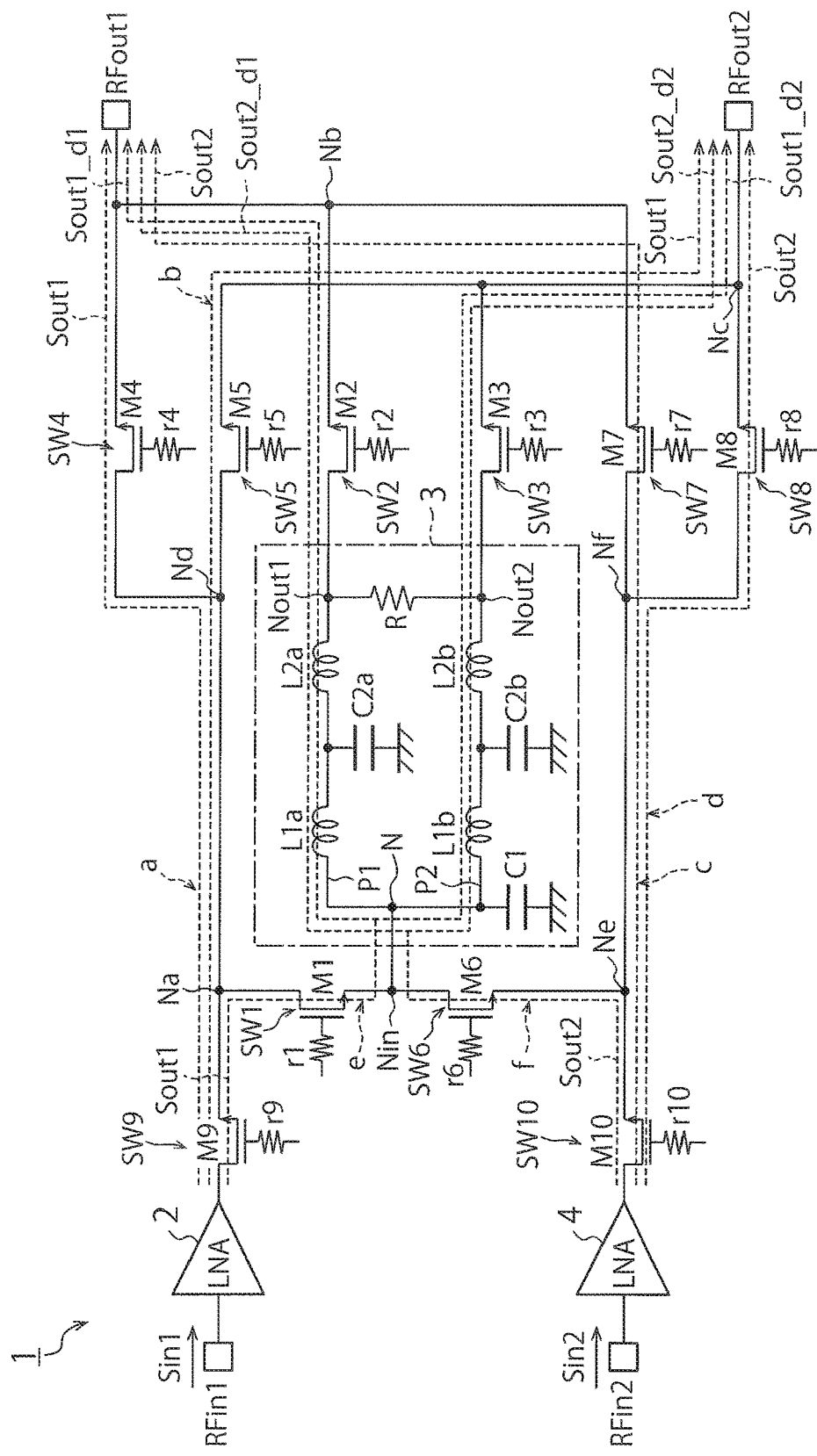
FIG. 4 is a circuit diagram illustrating a high-frequency semiconductor device according to a second embodiment.

A second embodiment using two high-frequency low-noise amplifiers is explained next. FIG. 4 is a circuit diagram illustrating the high-frequency semiconductor device 1 according to the second embodiment.

As illustrated in FIG. 4, the high-frequency semiconductor device 1 according to the second embodiment further includes a second high-frequency LNA 4 being an example of a second amplifier, and sixth to tenth switches SW6 to SW10 in addition to the first high-frequency LNA 2 and the first to fifth switches SW1 to SW5 explained in the first embodiment.

The second high-frequency LNA 4 amplifies a second high-frequency input signal Sin2 being an example of a second input signal and outputs a second high-frequency output signal Sout2 being an example of an output signal of the second amplifier.

As illustrated in FIG. 4, the second high-frequency LNA 4 is placed on the SOI substrate, and has one end connected to a second input terminal RFin2 and the other end connected to the input node Nin of the splitter 3. A basic circuit configuration of the second high-frequency LNA 4 is identical to that of the first high-frequency LNA 2. The second high-frequency LNA 4 outputs the second high-frequency output signal Sout2 obtained by amplifying the second high-frequency input signal Sin2 input from the second input terminal RFin2.

The first to tenth switches SW1 to SW10 switch whether the first high-frequency output signal Sout1 is output from the first output terminal RFout1, is output from the second output terminal RFout2, or is branched by the splitter 3 to be output from both the first and second output terminals RFout1 and RFout2, by switching control. The first to tenth switches SW1 to SW10 also switch whether the second high-frequency output signal Sout2 is output from the first output terminal RFout1, is output from the second output terminal RFout2, or is branched by the splitter 3 to be output from both the first and second output terminals RFout1 and RFout2, by the switching control.

Since the first to fifth switches SW1 to SW5 are identical to those of the first embodiment, detailed explanations thereof are omitted.

The ninth switch SW9 includes an nMOSFET M9 and a resistor r9. The nMOSFET M9 is connected between the first high-frequency LNA 2 and the output node Na of the first high-frequency LNA 2. The resistor r9 has a high resistance value such as 100 kΩ and is connected to a gate of the nMOSFET M9. The ninth switch SW9 is controlled to be on/off by a control signal input to the gate of the nMOSFET M9 via the resistor r9.

The tenth switch SW10 includes an nMOSFET M10 and a resistor r10. The nMOSFET M10 is connected between the second high-frequency LNA 4 and an output node Ne of the second high-frequency LNA 4. The resistor r10 has a high resistance value such as 100 kΩ and is connected to a gate of the nMOSFET M10. The tenth switch SW10 is controlled to be on/off by a control signal input to the gate of the nMOSFET M10 via the resistor r10.

The sixth switch SW6 includes an nMOSFET M6 and a resistor r6. The nMOSFET M6 is connected between the output node Ne of the second high-frequency LNA 4 and the input node Nin of the splitter 3. The resistor r6 has a high resistance value such as 100 kΩ and is connected to a gate of the nMOSFET M6. The sixth switch SW6 is controlled to be on/off by a control signal input to the gate of the nMOSFET M6 via the resistor r6.

The seventh switch SW7 includes an nMOSFET M7 and a resistor r7. The nMOSFET M7 is connected between the output node Ne of the second high-frequency LNA 4 and the first output terminal RFout1. More specifically, the nMOSFET M7 is connected between the output node Ne and the node Nb. The resistor r7 has a high resistance value such as 100 kΩ and is connected to a gate of the nMOSFET M7. The seventh switch SW7 is controlled to be on/off by a control signal input to the gate of the nMOSFET M7 via the resistor r7.

The eighth switch SW8 includes an nMOSFET M8 and a resistor r8. The nMOSFET M8 is connected between the output node Ne of the second high-frequency LNA 4 and the second output terminal RFout2. More specifically, the nMOSFET M8 is connected between a node Nf between the output node Ne and the nMOSFET M7 and the node Nc. The resistor r8 has a high resistance value such as 100 kΩ and is connected to a gate of the nMOSFET M8. The eighth switch SW8 is controlled to be on/off by a control signal input to the gate of the nMOSFET M8 via the resistor r8.

In the first to tenth switches SW1 to SW10 having the above configuration, the switches SW1 to SW3 and SW9 are turned on when the switches SW4 to SW8 and SW10 are turned off, whereby the first high-frequency output signal Sout1 is branched by the splitter 3 to be output from the first and second output terminals RFout1 and RFout2. The switches SW4 and SW9 are turned on when at least the switches SW1 to SW3 and SW5 to SW7 are turned off, whereby the first high-frequency output signal Sout1 is output from the first output terminal RFout1. The switches SW5 and SW9 are turned on when at least the switches SW1 to SW4, SW6, and SW8 are turned off, whereby the first high-frequency output signal Sout1 is output from the second output terminal RFout2.

The switches SW2, SW3, SW6, and SW10 are turned on when the switches SW1, SW4, SW5, and SW7 to SW9 are turned off, whereby the second high-frequency output signal Sout2 is branched by the splitter 3 to be output from the first and second output terminals RFout1 and RFout2. The switches SW7 and SW10 are turned on when at least the switches SW1 to SW4, SW6, and SW8 are turned off, whereby the second high-frequency output signal Sout2 is output from the first output terminal RFout1. The switches SW8 and SW10 are turned on when at least the switches SW1 to SW3 and SW5 to SW7 are turned off, whereby the second high-frequency output signal Sout2 is output from the second output terminal RFout2.

(Operation Mode)

FIG. 5 is a diagram illustrating a truth table of the high-frequency semiconductor device 1 according to the second embodiment. The high-frequency semiconductor device 1 having the above configuration according to the second embodiment can operate in three operation modes including a single output mode, a split mode, and an LNA-1,2 simultaneous operation mode as illustrated in the truth table of FIG. 5.

The single output mode in the second embodiment is an operation mode of outputting the high-frequency output signal Sout1 or Sout2 output from either the first high-frequency LNA 2 or the second high-frequency LNA 4 from either the first output terminal RFout1 or the second output terminal RFout2.

In the single output mode, when the first input terminal RFin and the first output terminal RFout1 are to be activated, a high-level control signal is applied to the gates of the nMOSFETs M9 and M4 and a low-level control signal is applied to the gates of the nMOSFETs M1 to M3, M5 to M8, and M10. Accordingly, the switches SW1 to SW3, SW5 to SW8, and SW10 are turned off and the switches SW9 and SW4 are turned on as illustrated in FIG. 5. By this on/off control, the first high-frequency output signal Sout1 passes through a signal path a in FIG. 4 via the switches SW9 and SW4 and is output from the first output terminal RFout1.

When the first input terminal RFin1 and the second output terminal RFout2 are to be activated in the single output mode, a high-level control signal is applied to the gates of the nMOSFETs M9 and M5 and a low-level control signal is applied to the gates of the nMOSFETs M1 to M4, M6 to M8, and M10. Accordingly, the switches SW1 to SW4, SW6 to SW8, and SW10 are turned off and the switches SW9 and SW5 are turned on as illustrated in FIG. 5. By this on/off control, the first high-frequency output signal Sout1 passes through a signal path b in FIG. 4 via the switches SW9 and SW5 and is output from the second output terminal RFout2.

When the second input terminal RFin2 and the first output terminal RFout1 are to be activated in the single output mode, a high-level control signal is applied to the gates of the nMOSFETs M10 and M7 and a low-level control signal is applied to the gates of the nMOSFETs M1 to M6, M8, and M9. This turns off the switches SW1 to SW6, SW8, and SW9 and turns on the switches SW10 and SW7 as illustrated in FIG. 5. By this on/off control, the second high-frequency output signal Sout2 passes through a signal path c in FIG. 4 via the switches SW10 and SW7 and is output from the first output terminal RFout1.

When the second input terminal RFin2 and the second output terminal RFout2 are to be activated in the single output mode, a high-level control signal is applied to the gates of the nMOSFETs M10 and M8 and a low-level control signal is applied to the gates of the nMOSFETs M1 to M7 and M9. This turns off the switches SW1 to SW7 and SW9 and turns on the switches SW10 and SW8 as illustrated in FIG. 5. By this on/off control, the second high-frequency output signal Sout2 passes through a signal path d in FIG. 4 via the switches SW10 and SW8 and is output from the second output terminal RFout2.

The split mode in the second embodiment is an operation mode of branching the high-frequency output signal Sout1 or Sout2 output from either the first high-frequency LNA 2 or the second high-frequency LNA 4 by the splitter 3 to be output from the first output terminal RFout1 and the second output terminal RFout2.

In the split mode, when the first input terminal RFin1 is to be activated, a high-level control signal is applied to the gates of the nMOSFETs M9 and M1 to M3 and a low-level control signal is applied to the gates of the nMOSFETs M4 to M8 and M10. Accordingly, the switches SW4 to SW8 and SW10 are turned off and the switches SW9 and SW1 to SW3 are turned on as illustrated in FIG. 5. By this on/off control, the first high-frequency output signal Sout1 passes through a signal path e in FIG. 4 via the splitter 3 and is output from the first output terminal RFout1 and the second output terminal RFout2. That is, the first high-frequency output signal Sout1 is branched by the splitter 3 into two signals, that is, the first high-frequency first branch signal Sout1_$d1$ and the first high-frequency second branch signal Sout1_$d2$.

The first high-frequency first branch signal Sout1_$d1$ is output from the first output terminal RFout1 and the first high-frequency second branch signal Sout1_$d2$ is output from the second output terminal RFout2.

When the second input terminal RFin2 is to be activated in the split mode, a high-level control signal is applied to the gates of the nMOSFETs M10, M2, M3, and M6 and a low-level control signal is applied to the gates of the nMOSFETs M1, M4, M5, M7, M8, and M9. Accordingly, the switches SW1, SW4, SW5, SW7, SW8, and SW9 are turned off and the switches SW10, SW2, SW3, and SW6 are turned on as illustrated in FIG. 5. By this on/off control, the second high-frequency output signal Sout2 passes through a signal path f in FIG. 4 via the splitter 3 and is output from the first output terminal RFout1 and the second output terminal RFout2. That is, the second high-frequency output signal Sout2 is split by the splitter 3 into two signals, that is, a second high-frequency first branch signal Sout2_$d1$ obtained by branching the second high-frequency output signal Sout2 into the first signal path P1, and a second high-frequency second branch signal Sout2_$d2$ obtained by branching the second high-frequency output signal Sout2 into the second signal path P2. The second high-frequency first branch signal Sout2_$d1$ is output from the first output terminal RFout1 and the second high-frequency second branch signal Sout2_$d2$ is output from the second output terminal RFout2.

The LNA-1,2 simultaneous operation mode is an operation mode of operating both the first high-frequency LNA 2 and the second high-frequency LNA 4 simultaneously. In the LNA-1,2 simultaneous operation mode, for example, high-frequency signals Sin1 and Sin2 belonging to different frequency bands are input to both the first input terminal RFin1 and the second input terminal RFin2, respectively. For example, a first high-frequency signal Sin1 belonging to 1.8 to 2.0 GHz can be input to the first input terminal RFin1 and a second high-frequency signal Sin2 belonging to 2.0 to 2.2 GHz can be input to the second input terminal RFin2.

When the first input terminal RFin1 is to be associated with the first output terminal RFout1 and the second input terminal RFin2 is to be associated with the second output terminal RFout2 in the LNA-1,2 simultaneous operation mode, a high-level control signal is applied to the gates of the nMOSFETs M9, M10, M4, and M8 and a low-level control signal is applied to the gates of the nMOSFETs M1 to M3 and M5 to M7. This turns off the switches SW1 to SW3 and SW5 to SW7 and turns on the switches SW9, SW10, SW4, and SW8 as illustrated in FIG. 5. By this on/off control, the first high-frequency output signal Sout1 passes through the signal path a in FIG. 4 and is output from the first output terminal RFout1, and the second high-frequency output signal Sout2 passes through the signal path d in FIG. 4 and is output from the second output terminal RFout2. That is, the single output mode of activating the first input terminal RFin1 and the first output terminal RFout1 and the single output mode of activating the second input terminal RFin2 and the second output terminal RFout2 are performed simultaneously.

When the first input terminal RFin1 is to be associated with the second output terminal RFout2 and the second input terminal RFin2 is to be associated with the first output terminal RFout1 in the LNA-1,2 simultaneous operation mode, a high-level control signal is applied to the gates of the nMOSFETs M9, M10, M5, and M7 and a low-level control signal is applied to the gates of the nMOSFETs M1 to M4, M6, and M8. This turns off the switches SW1 to SW4, SW6, and SW8 and turns on the switches SW9, SW10, SW5, and SW7 as illustrated in FIG. 5. By this on/off control, the first high-frequency output signal Sout1 passes through the signal path b in FIG. 4 and is output from the second output terminal RFout2 and the second high-frequency output signal Sout2 passes through the signal path c in FIG. 4 and is output from the first output terminal RFout1. That is, the single output mode of activating the first input terminal RFin1 and the second output terminal RFout2 and the single output mode of activating the second input terminal RFin2 and the first output terminal RFout1 are performed simultaneously.

According to the second embodiment, one splitter 3 can be shared by the two high-frequency LNAs 2 and 4, and therefore more operation modes than in the first embodiment can be realized with a compact configuration.

(Third Embodiment)

Figure 6:
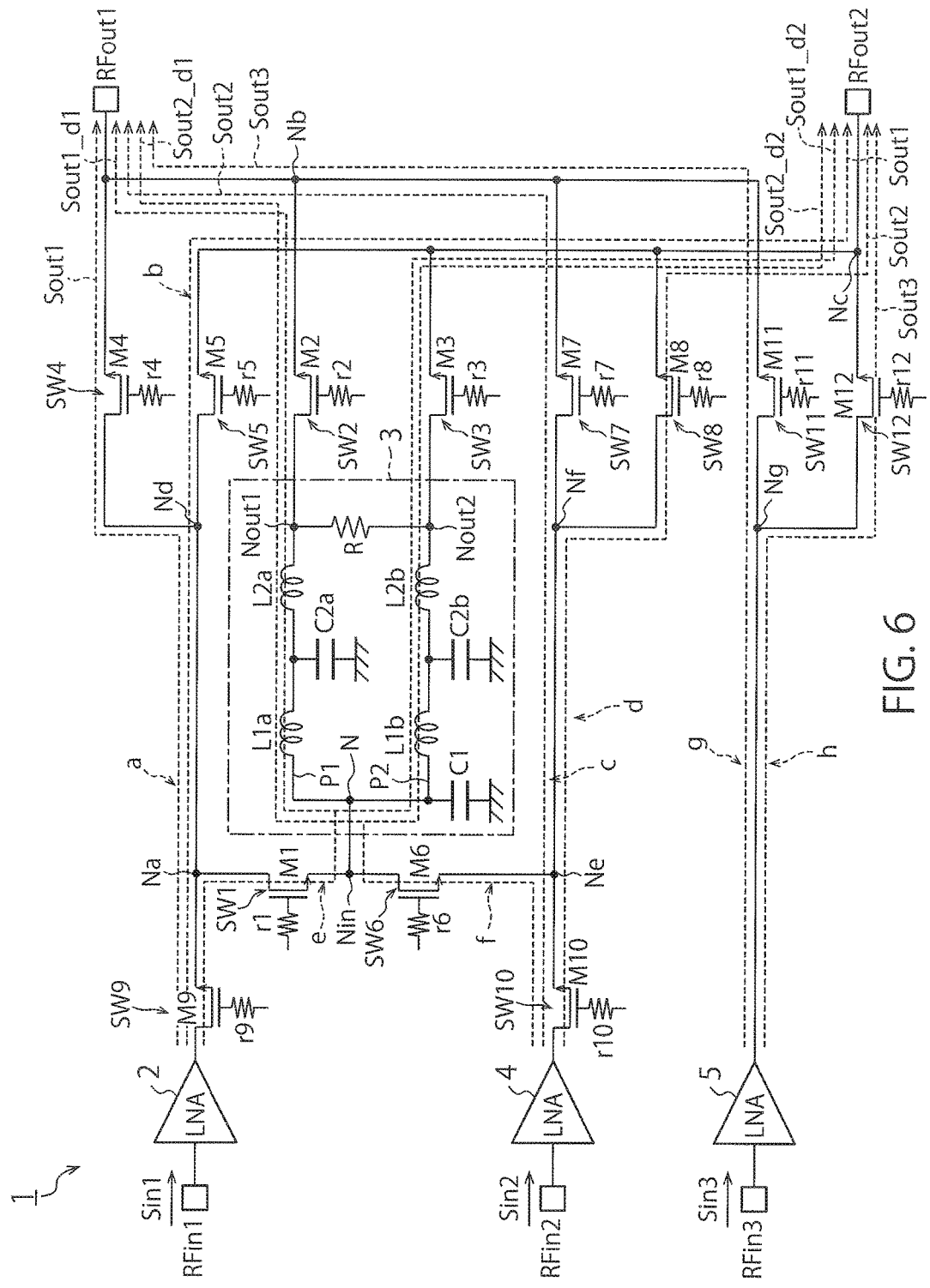
FIG. 6 is a circuit diagram illustrating a high-frequency semiconductor device according to a third embodiment.

A third embodiment using three high-frequency low-noise amplifiers is explained next. FIG. 6 is a circuit diagram illustrating the high-frequency semiconductor device 1 according to the third embodiment. As illustrated in FIG. 6, the high-frequency semiconductor device 1 according to the third embodiment further includes a third high-frequency LNA 5 being an example of a third amplifier, an eleventh switch SW11, and a twelfth switch SW12 in addition to the first high-frequency LNA 2, the second high-frequency LNA 4, and the first to tenth switches SW1 to SW10 explained in the second embodiment.

The third high-frequency LNA 5 amplifies a third high-frequency input signal Sin3 being an example of a third input signal and outputs a third high-frequency output signal Sout3 being an example of an output signal of the third amplifier.

As illustrated in FIG. 6, the third high-frequency LNA 5 is placed on the SOI substrate, and has one end connected to a third input terminal RFin3 and the other end having an output node Ng connected to the first output terminal RFout1 and the second output terminal RFout2. A basic circuit configuration of the third high-frequency LNA 5 is identical to that of the first high-frequency LNA 2. The third high-frequency LNA 5 outputs the third high-frequency output signal Sout3 obtained by amplifying the third high-frequency input signal Sin3 input from the third input terminal RFin3.

The first to twelfth switches SW1 to SW12 switch whether the first high-frequency output signal Sout1 is output from the first output terminal RFout1, is output from the second output terminal RFout2, or is branched by the splitter 3 to be output from both the first and second output terminals RFout1 and RFout2, by switching control. The first to twelfth switches SW1 to SW12 also switch whether the second high-frequency output signal Sout2 is output from the first output terminal RFout1, is output from the second output terminal RFout2, or is branched by the splitter 3 to be output from both the first and second output terminals RFout1 and RFout2, by the switching control. The first to twelfth switches SW1 to SW12 further switch whether the third high-frequency output signal Sout3 is output from the first output terminal RFout1 or the second output terminal RFout2, by the switching control.

The eleventh switch SW11 includes an nMOSFET M11 and a resistor r11. The nMOSFET M11 is connected between the output node Ng of the third high-frequency LNA 5 and the first output terminal RFout1. More specifically, the nMOSFET M11 is connected between the output node Ng and the node Nb. The resistor r11 has a high resistance value such as 100 kΩ and is connected to a gate of the nMOSFET M11. The eleventh switch SW11 is controlled to be on/off by a control signal input to the gate of the nMOSFET M11 via the resistor r11.

The twelfth switch SW12 includes an nMOSFET M12 and a resistor r12. The nMOSFET M12 is connected between the output node Ng of the third high-frequency LNA 5 and the second output terminal RFout2. More specifically, the nMOSFET M12 is connected between the output node Ng and the node Nc. The resistor r12 has a high resistance value such as 100 kΩ and is connected to a gate of the nMOSFET M12. The twelfth switch SW12 is controlled to be on/off by a control signal input to the gate of the nMOSFET M12 via the resistor r12.

In the eleventh and twelfth switches SW11 and SW12 having the above configuration, the eleventh switch SW11 is turned on when at least the switches SW1 to SW4, SW6, SW7, and SW12 are turned off, whereby the third high-frequency output signal Sout3 is output from the first output terminal RFout1. The twelfth switch SW12 is turned on when at least the switches SW1 to SW3, SW5, SW6, SW8, and SW11 are turned off, whereby the third high-frequency output signal Sout3 is output from the second output terminal RFout2.

(Operation Mode)

FIG. 7 is a diagram illustrating a truth table of the high-frequency semiconductor device 1 according to the third embodiment. The high-frequency semiconductor device 1 having the above configuration according to the third embodiment can operate in five operation modes including a single output mode, a split mode, an LNA-1,2 simultaneous operation mode, an LNA-1,3 simultaneous operation mode, and an LNA-2,3 simultaneous operation mode as illustrated in the truth table of FIG. 7.

The single output mode in the third embodiment is an operation mode of outputting the high-frequency output signal Sout1, Sout2, or Sout3 output from any one of the first high-frequency LNA 2, the second high-frequency LNA 4, and the high-frequency LNA 5 from the first output terminal RFout1 or the second output terminal RFout2.

In the single output mode, when the first input terminal RFin1 and the first output terminal RFout1 are to be activated, a high-level control signal is applied to the gates of the nMOSFETs M9 and M4 and a low-level control signal is applied to the gates of the nMOSFETs M1 to M3, M5 to M8, and M10 to M12. Accordingly, the switches SW1 to SW3, SW5 to SW8, and SW10 to SW12 are turned off and the switches SW9 and SW4 are turned on as illustrated in FIG. 7. By this on/off control, the first high-frequency output signal Sout1 passes through a signal path a in FIG. 6 via the switches SW9 and SW4 and is output from the first output terminal RFout1.

When the first input terminal RFin1 and the second output terminal RFout2 are to be activated in the single output mode, a high-level control signal is applied to the gates of the nMOSFETs M9 and M5 and a low-level control signal is applied to the gates of the nMOSFETs M1 to M4, M6 to M8, and M10 to M12. This turns off the switches SW1 to SW4, SW6 to SW8, and SW10 to SW12 and turns on the switches SW9 and SW5 as illustrated in FIG. 7. By this on/off control, the first high-frequency output signal Sout1 passes through a signal path b in FIG. 6 via the switches SW9 and SW5 and is output from the second output terminal RFout2.

When the second input terminal RFin2 and the first output terminal RFout1 are to be activated in the single output mode, a high-level control signal is applied to the gates of the nMOSFETs M10 and M7 and a low-level control signal is applied to the gates of the nMOSFETs M1 to M6, M8, M9, M11, and M12. This turns off the switches SW1 to SW6, SW8, SW9, SW11, and SW12 and turns on the switches SW10 and SW7 as illustrated in FIG. 7. By this on/off control, the second high-frequency output signal Sout2 passes through a signal path c in FIG. 6 via the switches SW10 and SW7 and is output from the first output terminal RFout1.

When the second input terminal RFin2 and the second output terminal RFout2 are to be activated in the single output mode, a high-level control signal is applied to the gates of the nMOSFETs M10 and M8 and a low-level control signal is applied to the gates of the nMOSFETs M1 to M7, M9, M11, and M12. Accordingly, the switches SW1 to SW7, SW9, SW11, and SW12 are turned off and the switches SW10 and SW8 are turned on as illustrated in FIG. 7. By this on/off control, the second high-frequency output signal Sout2 passes through a signal path d in FIG. 6 via the switches SW10 and SW8 and is output from the second output terminal RFout2.

When the third input terminal RFin3 and the first output terminal RFout1 are to be activated in the single output mode, a high-level control signal is applied to the gate of the nMOSFET M11 and a low-level control signal is applied to the gates of the nMOSFETs M1 to M10 and M12. Accordingly, the switches SW1 to SW10 and SW12 are turned off and the switch SW11 is turned on as illustrated in FIG. 7. By this on/off control, the third high-frequency output signal Sout3 passes through a signal path g in FIG. 6 via the switch SW11 and is output from the first output terminal RFout1.

When the third input terminal RFin3 and the second output terminal RFout2 are to be activated in the single output mode, a high-level control signal is applied to the gate of the nMOSFET M12 and a low-level control signal is applied to the gates of the nMOSFETs M1 to M11. Accordingly, the switches SW1 to SW11 are turned off and the switch SW12 is turned on as illustrated in FIG. 7. By this on/off control, the third high-frequency output signal Sout3 passes through a signal path h in FIG. 6 via the switch SW12 and is output from the second output terminal RFout2.

The split mode in the third embodiment is an operation mode of branching the high-frequency output signal Sout1 or Sout2 output from either the first high-frequency LNA 2 or the second high-frequency LNA 4 by the splitter 3 to be output from the first output terminal RFout1 and the second output terminal RFout2 similarly to the second embodiment.

In the split mode, when the first input terminal RFin1 is to be activated, a high-level control signal is applied to the gates of the nMOSFETs M9 and M1 to M3 and a low-level control signal is applied to the gates of the nMOSFETs M4 to M8 and M10 to M12. This turns off the switches SW4 to SW8 and SW10 to SW12 and turns on the switches SW9 and SW1 to SW3 as illustrated in FIG. 7. By this on/off control, the first high-frequency output signal Sout1 passes through a signal path e in FIG. 6 via the splitter 3 and is output from the first output terminal RFout1 and the second output terminal RFout2.

When the second input terminal RFin2 is to be set as an active input in the split mode, a high-level control signal is applied to the gates of the nMOSFETs M10, M2, M3, and M6 and a low-level control signal is applied to the gates of the nMOSFETs M1, M4, M5, M7 to M9, M11, and M12. This turns off the switches SW1, SW4, SW5, SW7 to SW9, SW11, and SW12 and turns on the switches SW10, SW2, SW3, and W6 as illustrated in FIG. 7. By this on/off control, the second high-frequency output signal Sout2 passes through a signal path f in FIG. 6 via the splitter 3 and is output from the first output terminal RFout1 and the second output terminal RFout2.

When the first input terminal RFin1 is to be associated with the first output terminal RFout1 and the second input terminal RFin2 is to be associated with the second output terminal RFout2 in the LNA-1,2 simultaneous operation mode, a high-level control signal is applied to the gates of the nMOSFETs M9, M10, M4, and M8 and a low-level control signal is applied to the gates of the nMOSFETs M1 to M3, M5 to M7, M11, and M12. Accordingly, as illustrated in FIG. 7, the switches SW1 to SW3, SW5 to SW7, SW11, and SW12 are turned off and the switches SW9, SW10, SW4, and SW8 are turned on. By this on/off control, the first high-frequency output signal Sout1 passes through the signal path a in FIG. 6 and is output from the first output terminal RFout1 and the second high-frequency output signal Sout2 passes through the signal path d in FIG. 6 and is output from the second output terminal RFout2.

When the first input terminal RFin1 is to be associated with the second output terminal RFout2 and the second input terminal RFin2 is to be associated with the first output terminal RFout1 in the LNA-1,2 simultaneous operation mode, a high-level control signal is applied to the gates of the nMOSFETs M9, M10, M5, and M7 and a low-level control signal is applied to the gates of the nMOSFETs M1 to M4, M6, M8, M11, and M12. Accordingly, as illustrated in FIG. 7, the switches SW1 to SW4, SW6, SW8, SW11, and SW12 are turned off and the switches SW9, SW10, SW5, and SW7 are turned on. By this on/off control, the first high-frequency output signal Sout1 passes through the signal path b in FIG. 6 and is output from the second output terminal RFout2 and the second high-frequency output signal Sout2 passes through the signal path c in FIG. 6 and is output from the first output terminal RFout1.

The LNA-1,3 simultaneous operation mode is an operation mode in which both the first high-frequency LNA 2 and the third high-frequency LNA 5 operate simultaneously. Similarly to the LNA-1,2 simultaneous operation mode, high-frequency signals Sin1 and Sin3 belonging to different frequency bands can be input to both the first input terminal FRin1 and the third input terminal RFin3, respectively, in the LNA-1,3 simultaneous operation mode.

When the first input terminal RFin1 is to be associated with the first output terminal RFout1 and the third input terminal RFin3 is to be associated with the second output terminal RFout2 in the LNA-1,3 simultaneous operation mode, a high-level control signal is applied to the gates of the nMOSFETs M9, M4, and M12 and a low-level control signal is applied to the gates of the nMOSFETs M1 to M3, M5 to M8, M10, and M11. Accordingly, the switches SW1 to SW3, SW5 to SW8, SW10, and SW11 are turned off and the switches SW9, SW4, and SW12 are turned on as illustrated in FIG. 7. By this on/off control, the first high-frequency output signal Sout1 passes through the signal path a in FIG. 6 and is output from the first output terminal RFout1 and the third high-frequency output signal Sout3 passes through the signal path h in FIG. 6 and is output from the second output terminal RFout2.

When the first input terminal RFin1 is to be associated with the second output terminal RFout2 and the third input terminal RFin3 is to be associated with the first output terminal RFout1 in the LNA-1,3 simultaneous operation mode, a high-level control signal is applied to the gates of the nMOSFETs M9, M5, and M11 and a low-level control signal is applied to the gates of the nMOSFETs M1 to M4, M6 to M8, M10, and M12. Accordingly, the switches SW1 to SW4, SW6 to SW8, SW10, and SW12 are turned off and the switches SW9, SW5, and SW11 are turned on as illustrated in FIG. 7. By this on/off control, the first high-frequency output signal Sout1 passes through the signal path b in FIG. 6 and is output from the second output terminal RFout2 and the third high-frequency output signal Sout3 passes through the signal path g in FIG. 6 and is output from the first output terminal RFout1.

The LNA-2,3 simultaneous operation mode is an operation mode in which both the second high-frequency LNA 4 and the third high-frequency LNA 5 operate simultaneously. Similarly to the LNA-1,2 simultaneous operation mode, high-frequency signals Sin2 and Sin3 belonging to different frequency bands can be input to both the second input terminal RFin2 and the third input terminal RFin3, respectively, in the LNA-2,3 simultaneous operation mode.

When the second input terminal RFin2 is to be associated with the first output terminal RFout1 and the third input terminal RFin3 is to be associated with the second output terminal RFout2 in the LNA-2,3 simultaneous operation mode, a high-level control signal is applied to the gates of the nMOSFETs M10, M7, and M12 and a low-level control signal is applied to the gates of the nMOSFETs M1 to M6, M8, M9, and M11. This turns off the switches SW1 to SW6, SW8, SW9, and SW11 and turns on the switches SW10, SW7, and SW12 as illustrated in FIG. 7. By this on/off control, the second high-frequency output signal Sout2 passes through the signal path c in FIG. 6 via the switches SW10 and SW7 and is output from the first output terminal RFout1 and the third high-frequency output signal Sout3 passes through the signal path h in FIG. 6 via the switch SW12 and is output from the second output terminal RFout2.

When the second input terminal RFin2 is to be associated with the second output terminal RFout2 and the third input terminal RFin3 is to be associated with the first output terminal RFout1 in the LNA-2,3 simultaneous operation mode, a high-level control signal is applied to the gates of the nMOSFETs M10, M8, and M11 and a low-level control signal is applied to the gates of the nMOSFETs M1 to M7, M9, and M12. This turns off the switches SW1 to SW7, SW9, and SW12 and turns on the switches SW10, SW8, and SW11 as illustrated in FIG. 7. By this on/off control, the second high-frequency output signal Sout2 passes through the signal path d in FIG. 6 and is output from the second output terminal RFout2 and the third high-frequency output signal Sout3 passes through the signal path g in FIG. 6 and is output from the first output terminal RFout1.

According to the third embodiment, two high-frequency LNAs 2 and 4 can share one splitter 3 and further the high-frequency LNA 5 can amplify the third high-frequency signal to be output from the first or second output terminal. Therefore, more operation modes than in the second embodiment can be realized with a compact configuration.

(Fourth Embodiment)

Figure 8:
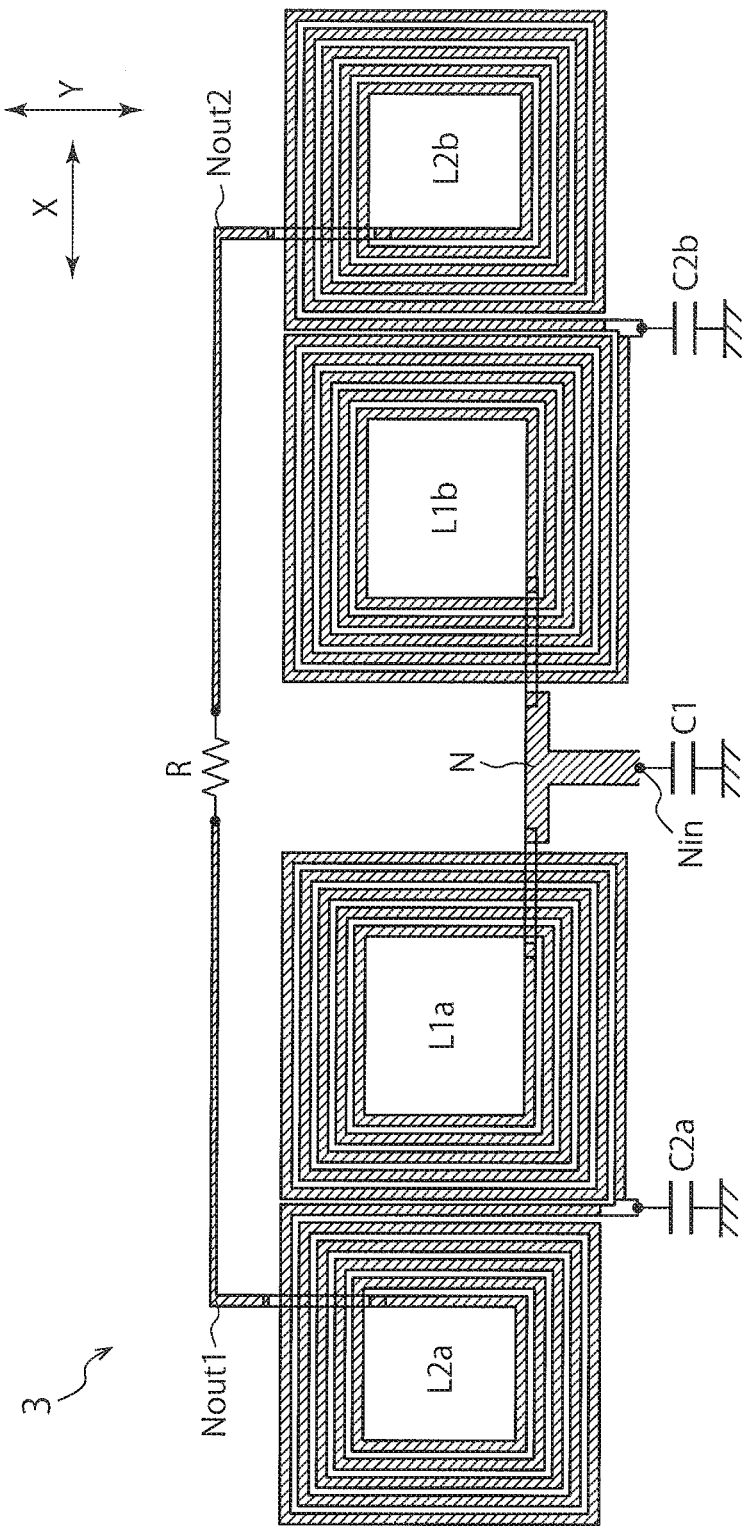
FIG. 8 is a layout diagram of a splitter in a high-frequency semiconductor device according to a fourth embodiment.

A fourth embodiment describing a specific example of the splitter 3 in the first to third embodiments is explained next. FIG. 8 is a layout diagram of the splitter 3 in the high-frequency semiconductor device 1 according to the first to third embodiments.

As illustrated in FIG. 8, in the splitter 3 according to the fourth embodiment, a set of the first spiral inductor L1a and the second spiral inductor L2a, and a set of the third spiral inductor L1b and the fourth spiral inductor L2b are provided to have a symmetrical shape in an X direction in FIG. 8 about the input node Nin. The first to fourth spiral inductors L1a, L2a, L1b, and L2b are arranged linearly along the X direction.

The first spiral inductor L1a has a substantially-square outer shape including sides parallel to the X direction and sides parallel to a Y direction when viewed planarly, and is wound in a clockwise direction in FIG. 8 from an inner circumference side to an outer circumference side. The first spiral inductor L1a causes a high-frequency output signal (that is, a current) of a high-frequency LNA flown therein from the input node Nin to flow in the clockwise direction.

The second spiral inductor L2a has a substantially-square outer shape including sides parallel to the X direction and sides parallel to the Y direction when viewed planarly, and is wound in a counterclockwise direction in FIG. 8 from an outer circumference side to an inner circumference side. The second spiral inductor L2a causes the high-frequency output signal flown therein from the first spiral inductor L1a to flow in the counterclockwise direction.

Due to these winding directions of the first spiral inductor L1a and the second spiral inductor L2a being opposite to each other, the coupling coefficient between the first spiral inductor L1a and the second spiral inductor L2a becomes positive.

The third spiral inductor L1b is placed at an opposite position to the first spiral inductor L1a with respect to the input node Nin. The third spiral inductor L1b has a substantially-square outer shape including sides parallel to the X direction and sides parallel to the Y direction when viewed planarly and is wound in the counterclockwise direction in FIG. 8 from an inner circumference side to an outer circumference side. The third spiral inductor L1b causes a high-frequency output signal of a high-frequency LNA flown therein from the input node Nin to flow in the counterclockwise direction.

The fourth spiral inductor L2b has a substantially-square outer shape including sides parallel to the X direction and sides parallel to the Y direction when viewed planarly and is wound in the clockwise direction in FIG. 8 from an outer circumference side to an inner circumference side. The fourth spiral inductor L2b causes the high-frequency output signal flown therein from the third spiral inductor L1b to flow in the clockwise direction.

Due to these winding directions of the third spiral inductor L1b and the fourth spiral inductor L2b being opposite to each other, the coupling coefficient between the third spiral inductor L1b and the fourth spiral inductor L2b becomes positive.

Because the first and second spiral inductors L1a and L2a and the third and fourth spiral inductors L1b and L2b are symmetric in the X direction about the input node Nin, the coupling coefficient between the first and second spiral inductors L1a and L2a is equal to the coupling coefficient between the third and fourth spiral inductors L1b and L2b. Because the distance between the first spiral inductor L1a and the third spiral inductor L1b is sufficiently large, the coupling coefficient between the first spiral inductor L1a and the third spiral inductor L1b is negligibly small.

In the splitter 3 of the fourth embodiment, the first capacitor C1, the second capacitor C2a, and the third capacitor C2b can be formed of an MIM (Metal-Insulator-Metal) capacitor or an MOM (Metal-Oxide-Metal) capacitor.

Figure 9A:
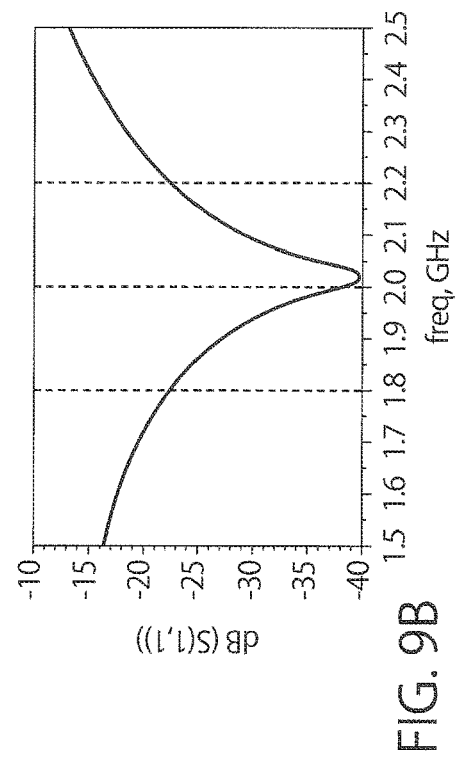
FIGS. 9A, 9B, 9C, and 9D are graphs indicating S parameters of the splitter in the high-frequency semiconductor device according to the fourth embodiment.
Figure 9B:
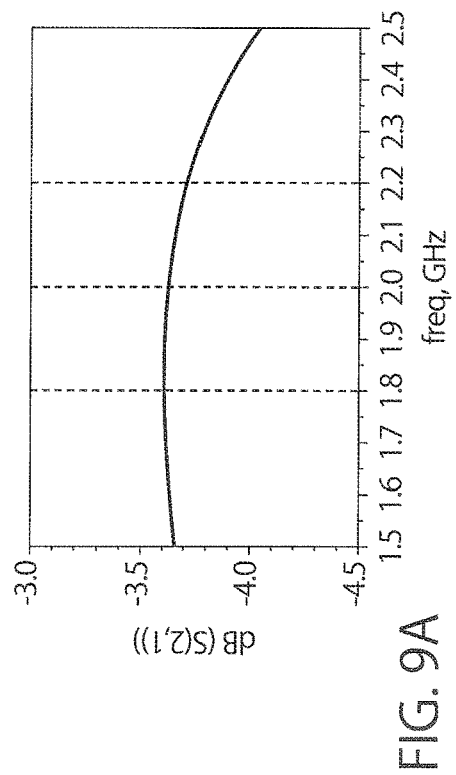
Figure 9C:
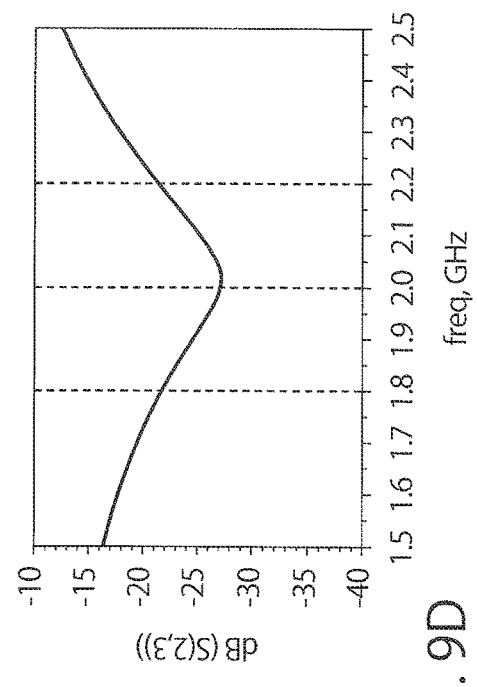
Figure 9D:
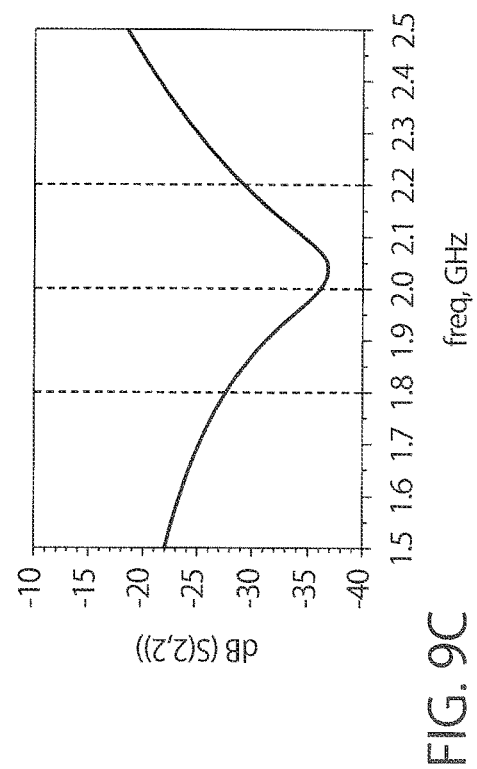

S parameter characteristics of the splitter 3 having the above configuration in the fourth embodiment are explained next. FIG. 9A is a graph indicating an S parameter $S_{21}$ of the splitter 3 in a case where the input node Nin is a port 1, the first output node Nout1 is a port 2, and the second output node Nout2 is a port 3 in the high-frequency semiconductor device 1 according to the fourth embodiment. FIG. 9B is a graph indicating an S parameter $S_{11}$ of the splitter 3 in the high-frequency semiconductor device 1 according to the fourth embodiment. FIG. 9C is a graph indicating an S parameter $S_{22}$ of the splitter 3 in the high-frequency semiconductor device 1 according to the fourth embodiment. FIG. 9D is a graph indicating an S parameter $S_{23}$ of the splitter 3 in the high-frequency semiconductor device 1 according to the fourth embodiment.

In the splitter 3 corresponding to the S parameters of FIGS. 9A to 9D, the first spiral inductor L1a and the third spiral inductor L1b have parameters described below.
 The number N of windings: 5.25
 The length D of one side of the outer shape: 190 micrometers
 The line width W: 6 micrometers
 The line space S: 4 micrometers In the splitter 3 corresponding to the S parameters of FIGS. 9A to 9D, the second spiral inductor L2a and the fourth spiral inductor L2b have parameters described below.
 The number N of windings: 5.25
 The length D of one side of the outer shape: 175 micrometers
 The line width W: 6 micrometers
 The line space S: 4 micrometers In the splitter 3 corresponding to the S parameters of FIGS. 9A to 9D, the capacitance of the first capacitor C1 is 0.254 pF and the capacitance of the second capacitor C2a and the third capacitor C2b is 1.131 pF. The resistance value of the resistor R is 100 Ω.

In FIGS. 9A to 9D, the horizontal axis represents the frequency (GHz) and the vertical axis represents the magnitude (dB) of the respective S parameters. The use band of the high-frequency semiconductor device 1 is 1.8 GHz to 2.2 GHz.

$S_{21}$ denotes an S parameter related to transmission characteristics of a signal from the input node Nin to the first output node Nout1. A larger value of the S parameter $S_{21}$ means that a signal from the input node Nin to the first output node Nout1 has a smaller loss. As shown in FIG. 9A, the worst value of the S parameter $S_{21}$ in the use band (1.8 GHz to 2.2 GHz) is −3.7 dB. Because the splitter 3 has a configuration to split a high-frequency output signal from the input node Nin into two, that is, to equally split the high-frequency output signal, the splitter 3 has an attenuation amount of at least 3 dB in principle. The S parameter $S_{21}$ of −3.7 dB means that a substantial loss due to a parasitic resistance is 0.7 dB. Generally, it can be said that the characteristics are satisfactory when the loss is equal to or lower than 1 dB, and therefore the S parameter $S_{21}$ of FIG. 9A indicates satisfactory characteristics in which the loss of a signal transmitted from the input node Nin to the first output node Nout1 is sufficiently suppressed.

$S_{11}$ denotes an S parameter related to reflection characteristics of a signal at the input node Nin and a smaller value of the S parameter $S_{11}$ indicates a smaller loss due to reflection at the input node Nin. Because the values of the S parameter $S_{11}$ in the use band (1.8 to 2.2 GHz) are equal to or lower than −20 dB as illustrated in FIG. 9B, the S parameter $S_{11}$ of FIG. 9B indicates satisfactory characteristics in which the loss due to reflection at the input node Nin is sufficiently suppressed.

$S_{22}$ denotes an S parameter related to reflection characteristics of a signal at the first output node Nout1 and a smaller value of the parameter $S_{22}$ indicates a smaller loss due to reflection at the first output node Nout1. Because the values of the S parameter $S_{22}$ in the use band (1.8 to 2.2 GHz) are equal to or lower than −20 dB as illustrated in FIG. 9C, the S parameter $S_{22}$ of FIG. 9C indicates satisfactory characteristics in which the loss due to reflection at the first output node Nout1 is sufficiently suppressed.

$S_{23}$ denotes an S parameter related to transmission characteristics of a signal from the second output node Nout2 to the first output node Nout1. A larger value of the S parameter $S_{23}$ means that isolation between the first output node Nout1 and the second output node Nout2 is poorer. Because the values of the S parameter $S_{23}$ in the use band (1.8 to 2.2 GHz) are equal to or lower than −20 dB as illustrated in FIG. 9D, the S parameter $S_{23}$ of FIG. 9D indicates satisfactory characteristics in which the isolation between the first output node Nout1 and the second output node Nout2 is sufficiently provided.

While the sum of the inductances is 10.638 nH in a case where the first and second spiral inductors L1a and L2a are provided independently, the inductance from the input node Nin to the first output node Nout1 in the splitter 3 of the fourth embodiment becomes 12.124 nH, that is, is increased by 14% due to the layout illustrated in FIG. 8. This is because the coupling coefficient between the first spiral inductor L1a and the second spiral inductor L2a is positive and thus the mutual inductance of the both inductors is added to the sum of the self-inductances. Accordingly, the inductance required to configure the splitter 3 can be realized in a small layout area. This holds true for the third spiral inductor L1b and the fourth spiral inductor L2b.

Figure 10:
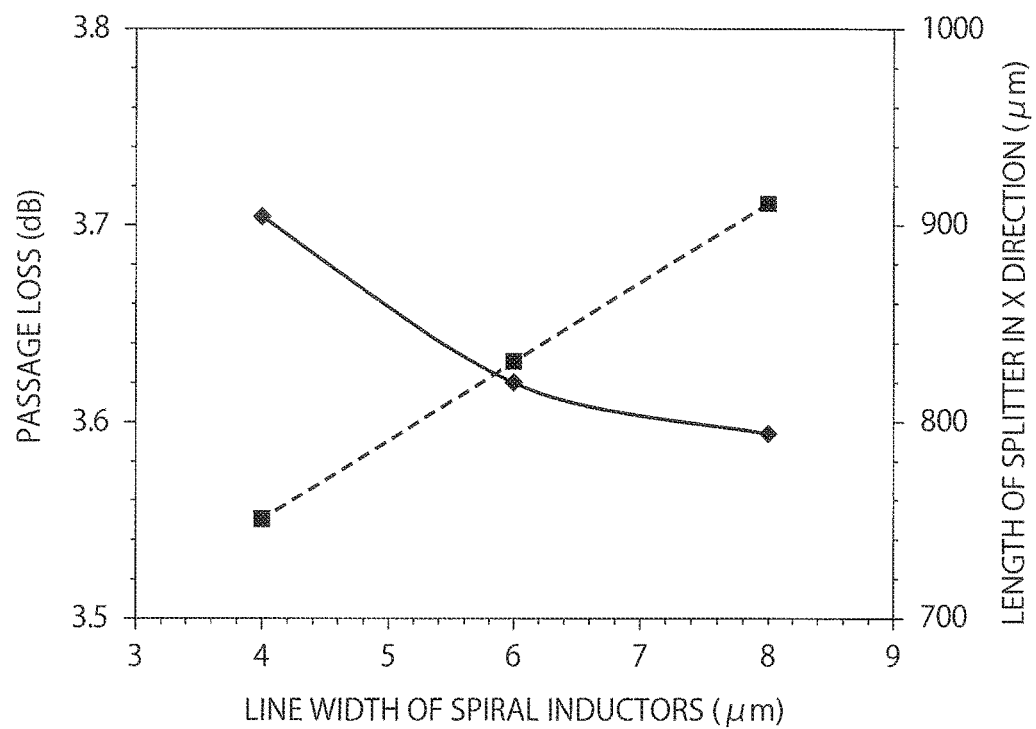
FIG. 10 is a graph indicating the dependency of a passage loss of the splitter and the length of the splitter upon a line width of spiral inductors in the high-frequency semiconductor device according to the fourth embodiment.

An example of a preferable line width W of the spiral inductors L1a, L2a, L1b, and L2b is explained next. FIG. 10 is a graph indicating the dependency of the passage loss of the splitter 3 and the length of the splitter 3 upon the line width of the spiral inductors in the high-frequency semiconductor device 1 according to the fourth embodiment. More specifically, a solid line graph in FIG. 10 is a graph indicating the dependency of the passage loss and a dashed line graph in FIG. 10 is a graph indicating the dependency of the length of the splitter 3. The horizontal axis in FIG. 10 represents the line width of the spiral inductors L1a, L2a, L1b, and L2b. The vertical axis in FIG. 10 represents the passage loss of the splitter 3 and the length in the X direction of the splitter 3.

As illustrated in FIG. 10, when the line width W of the spiral inductors L1a, L2a, L1b, and L2b is smaller, the length of the splitter 3 becomes smaller while the passage loss becomes larger. FIG. 10 indicates that the inclination of the passage loss becomes large and the passage loss increases rapidly when the line width W becomes smaller than 6 micrometers.

In view of these characteristics, it is preferable that the line width W of the spiral inductors L1a, L2a, L1b, and L2b be substantially 6 micrometers. When the line width W is set to 6 micrometers, suppression of the layout area and suppression of the passage loss can both be achieved.

According to the fourth embodiment, due to the layout of the spiral inductors L1a, L2a, L1b, and L2b to have a positive coupling coefficient, the inductance required for the splitter 3 can be ensured while the size is suppressed.

(Fifth Embodiment)

An example of preferable line widths of the spiral inductor Ls and the inductor Ld of the first high-frequency LNA 2 in the first to third embodiments is explained next as a fifth embodiment.

It is desirable that the line width of the spiral inductor Ls is set to a large value such as 16 micrometers. This is because the parasitic resistance as small as several tenths of Ω of the spiral inductor Ls leads to a significant deterioration of the noise factor NF. The value of the spiral inductor Ls is about 1 nH in an LNA for a 2-GHz band and thus the number of windings in the spiral inductor Ls is relatively small. Accordingly, even when the line width is increased to 16 micrometers, the size of the outer shape can be suppressed and can have a relatively small value of about 150 micrometers.

Meanwhile, it is desirable that the line width of the inductor Ld is set to a small value such as 4 micrometers. Because the value of the inductor Ld is about 10 nH in an LNA for the 2-GHz band, the size of the outer shape is increased if the line width is not small. Due to a small line width, the parasitic resistance of the inductor Ld is increased and the quality factor (Q factor) is reduced. However, when the line width is about 4 micrometers, the reduction in the Q factor does not cause a problem. This is because the resistor Rd is connected in parallel to the inductor Ld for stabilization as illustrated in FIG. 2. Specifically, an increase in the value of the resistor Rd to allow for a reduction in the Q factor of the inductor Ld can reduce a combined resistance of the resistor Rd and the parasitic resistance of the inductor Ld and thus a parallel circuit including the inductor Ld and the resistor Rd can provide a sufficiently large Q factor.

From the above viewpoint, it is desirable that the line width of the spiral inductor Ls and the line width of the inductor Ld meet a following expression.

$$WLd < W1 < WLs \tag{1}$$

In the expression (1), WLd is a line width of the inductor Ld, W1 is the respective line widths of all the spiral inductors L1a, L2a, L1b, and L2b in the splitter 3, and WLs is a line width of the spiral inductor Ls.

According to the fifth embodiment, the size, the noise, and the loss can be suppressed in a balanced manner by setting the line width of the spiral inductor Ls to be larger than that of the spiral inductors L1a, L2a, L1b, and L2b and setting the line width of the inductor Ld to be smaller than that of the spiral inductors L1a, L2a, L1b, and L2b.

(Modification)

Figure 11A:
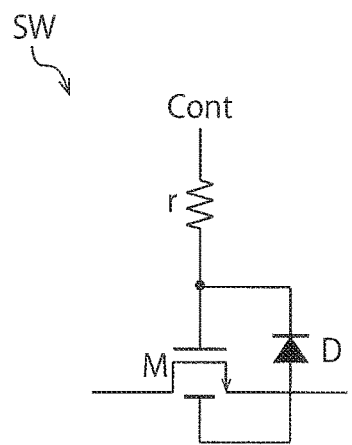
FIGS. 11A and 11B are diagrams illustrating a modification of switches.
Figure 11B:
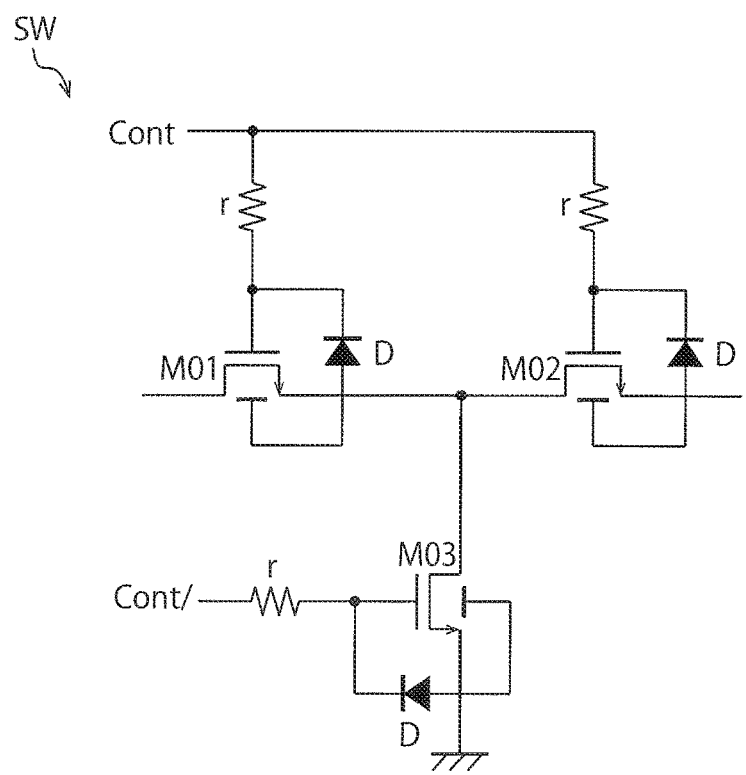

Modifications of the switches in the first to third embodiments are explained next. FIG. 11A is a diagram illustrating a first modification of the switches. FIG. 11B is a diagram illustrating a second modification of the switches.

The switches SW in the respective embodiments described above are each formed of an nMOSFET. However, the switches SW are not limited to this configuration.

For example, as illustrated in FIG. 11A, the switch SW can have a configuration including a diode D that includes an anode connected to the body of an nMOSFET and a cathode connected to a gate of the nMOSFET. The switch SW in FIG. 11A is an effective configuration when a negative potential is applied to the gate as a low-level control signal Cont that brings the nMOSFET into an off-state.

Applying the control signal Cont of a negative potential to turn off the nMOSFET has an advantage that Vth for turning on the nMOSFET can be set to a value near 0 volt and thus Vgs−Vth in the on-state becomes large, which reduces the on-resistance.

According to the switch SW of FIG. 11A, the diode D is connected between the body and the gate of the nMOSFET with the anode located on the body side, whereby a hole of the body passes through the diode D to the gate at the time of application of the control signal Cont of a negative potential, so that a breakdown voltage between a drain and a source can be improved. Accordingly, the off-state can be maintained even when an output amplitude of an LNA is large.

Furthermore, as illustrated in FIG. 11B, the switch SW can be a T-type switch including the switch SW illustrated in FIG. 11A as a basic configuration. In the switch SW of FIG. 11B, a drain of an nMOSFET M03 having a source grounded is connected between an nMOSFET M01 and an nMOSFET M02 cascode-connected and constituting a path of a high-frequency signal. In each of the nMOSFETs M01 to M03, a diode D is connected between the body and a gate with an anode located on the body side similarly in FIG. 11A. A control signal Cont/ that is obtained by inverting the logic of the control signal Cont applied to the gates of the nMOSFETs M01 and M02 is applied to the gate of the nMOSFET M03.

According to the T-type switch of FIG. 11B, a source of the nMOSFET M01 and a drain of the nMOSFET M02 can be grounded by turning on the nMOSFET M03 during the off-state of the nMOSFET M01 and the nMOSFET M02. This enables the off-state to be maintained more effectively than in the switch SW of FIG. 11A.

(Sixth Embodiment)

Figure 12:
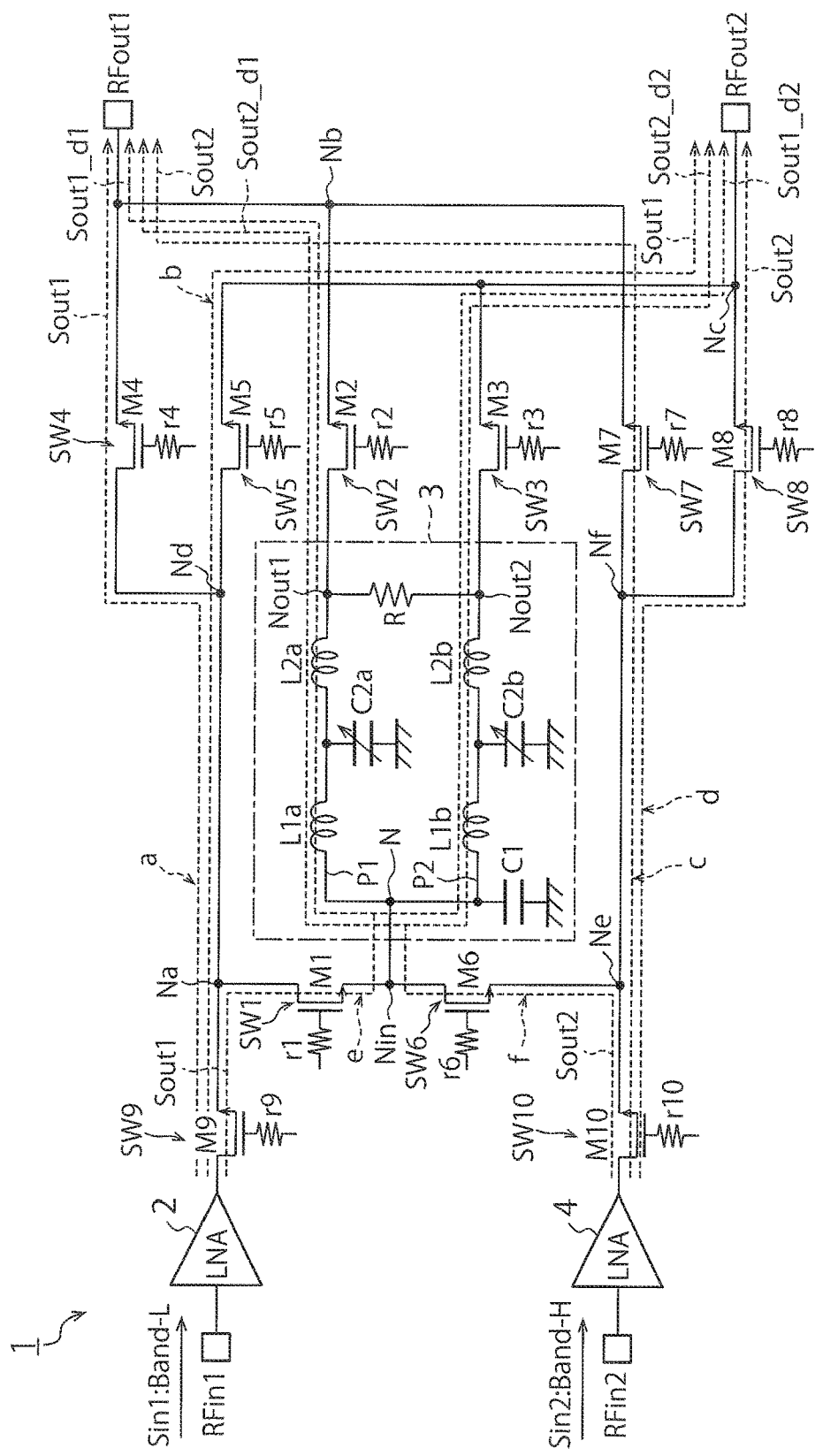
FIG. 12 is a circuit diagram illustrating a high-frequency semiconductor device according to a sixth embodiment.

A sixth embodiment in which the second capacitor C2a and the third capacitor C2b are variable capacitors in the high-frequency semiconductor device 1 including the first high-frequency LNA 2 and the second high-frequency LNA 4 is explained next. FIG. 12 is a circuit diagram illustrating the high-frequency semiconductor device 1 according to the sixth embodiment.

In the second embodiment illustrated in FIGS. 4 and 5, an example in which the second capacitor C2a and the third capacitor C2b are fixed capacitors having a fixed capacitance in the high-frequency semiconductor device 1 including the first high-frequency LNA 2 and the second high-frequency LNA 4 has been explained.

In contrast thereto, the second capacitor C2a in the sixth embodiment is an example of a first variable capacitor having a capacitance that can be changed. Specifically, the second capacitor C2a has one end connected between the first spiral inductor L1a and the second spiral inductor L2a and the other end connected to the ground potential being an example of a third reference potential, and has a variable capacitance.

The third capacitor C2b is an example of a second variable capacitor having a capacitance that can be changed. Specifically, the third capacitor C2b has one end connected between the third spiral inductor L1b and the fourth spiral inductor L2b and the other end connected to the ground potential being an example of a fourth reference potential, and has a variable capacitance.

Figures 13, 14:
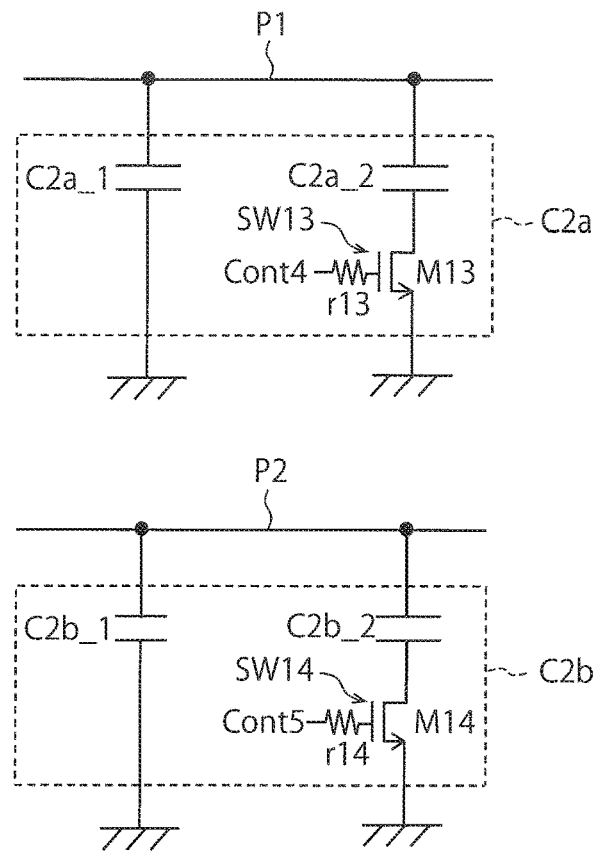
FIG. 13 is a circuit diagram illustrating variable capacitors in the high-frequency semiconductor device according to the sixth embodiment.
FIG. 14 is a diagram illustrating a correspondence relation between an input signal and a control signal for variable capacitors in the high-frequency semiconductor device according to the sixth embodiment.

FIG. 13 is a circuit diagram illustrating the variable capacitors C2a and C2b in the high-frequency semiconductor device 1 according to the sixth embodiment. More specifically, the second capacitor C2a includes two capacitors C2a_1 and C2a_2 connected in parallel between the first signal path P1 and the ground potential (the third reference potential), and a switch SW13 connected in series with the capacitor C2a_2 located on the side of the second spiral inductor L2a out of the two capacitors C2a_1 and C2a_2 as illustrated in FIG. 13. The capacitor C2a_1 located on the side of the first spiral inductor L1a has a larger capacitance than the capacitor C2a_2 located on the side of the second spiral inductor L2a and connected with the switch SW13.

The switch SW13 includes an nMOSFET M13 and a resistor r13 connected to a gate of the nMOSFET M13. The switch SW13 is controlled to be on/off by a fourth control signal Cont4 input to the gate of the nMOSFET M13 via the resistor r13. When the switch SW13 is turned on, the second capacitor C2a has a parallel combined capacitance of the two capacitors C2a_1 and C2a_2. On the other hand, when the switch SW13 is turned off, the second capacitor C2a has a capacitance due to one capacitor C2a_1. Therefore, the capacitance of the second capacitor C2a can be switched according to the on/off control of the switch SW13. The number of capacitors included in the second capacitor C2a is not limited to two and three or more capacitors can be included therein.

As illustrated in FIG. 13, the third capacitor C2b includes two capacitors C2b_1 and C2b_2 connected in parallel between the second signal path P2 and the ground potential (the fourth reference potential), and a switch SW14 connected in series with the capacitor C2b_2 located on the side of the fourth spiral inductor L2b out of the two capacitors C2b_1 and C2b_2. The capacitor C2b_1 located on the side of the third spiral inductor L1b has a larger capacitor than the capacitor C2b_2 located on the side of the fourth spiral inductor L2b and connected with the switch SW14.

The capacitor C2b_1 has the same capacitance as that of the capacitor C2a_1 of the second capacitor C2a. The capacitor C2b_2 has the same capacitance as that of the capacitor C2a_2 of the second capacitor C2a.

The switch SW14 has an nMOSFET M14 and a resistor r14 connected to a gate of the nMOSFET M14. The switch SW14 is controlled to be on/off by a fifth control signal Cont5 input to the gate of the nMOSFET M14 via the resistor r14. When the switch SW14 is turned on, the third capacitor C2b has a parallel combined capacitance due to the two capacitors C2b_1 and C2b_2. On the other hand, when the switch SW14 is turned off, the third capacitor C2b has a capacitance due to one capacitor C2b_1. Therefore, the capacitance of the third capacitor C2b can be switched according to the on/off control of the switch SW14. The number of capacitors included in the third capacitor C2b is not limited to two and three or more capacitors can be included therein.

Similarly to the second embodiment, the first to tenth switches SW1 to SW10 (the output controller) switch whether the first high-frequency output signal Sout1 is output from the first output terminal RFout1, is output from the second output terminal RFout2, or is branched by the splitter 3 to be output from both the first and second output terminals RFout1 and RFout2, by switching control. The first to tenth switches SW1 to SW10 also switch whether the second high-frequency output signal Sout2 is output from the first output terminal RFout1, is output from the second output terminal RFout2, or is branched by the splitter 3 to be output from both the first and second output terminals RFout1 and RFout2, by the switching control.

In the sixth embodiment, as illustrated in FIG. 12, the first high-frequency input signal Sin1 input to the first high-frequency LNA 2 is a signal in a low-frequency band Band-L and the second high-frequency input signal Sin2 input to the second high-frequency LNA 4 is a signal in a high-frequency band Band-H. Associated therewith, the first high-frequency output signal Sout1 output from the first high-frequency LNA 2 is a signal in the low-frequency band Band-L and the second high-frequency output signal Sout2 output from the second high-frequency LNA 4 is a signal in the high-frequency band Band-H.

The low-frequency band Band-L is, for example, 1805 MHz to 2025 MHz. The high-frequency band Band-H is, for example, 2110 MHz to 2200 MHz.

In order to improve the signal characteristics of the splitter 3 corresponding to the different frequency bands Band-L and Band-H having certain bandwidths, respectively, the switches SW13 and SW14 (the output controller) switch the capacitance of the variable capacitors C2a and C2b to different values between when the first high-frequency output signal Sout1 in the low-frequency band Band-L is to be branched by the splitter 3 and output and when the second high-frequency output signal Sout2 in the high-frequency band Band-H is to be branched by the splitter 3 and output. Switching of the capacitance by the variable capacitors C2a and C2b is explained specifically below with reference to FIG. 14.

FIG. 14 is a diagram illustrating a correspondence relation between an input signal and a control signal for the variable capacitors in the high-frequency semiconductor device 1 according to the sixth embodiment. As illustrated in FIG. 14, when the first high-frequency output signal Sout1 in the low-frequency band Band-L is to be branched by the splitter 3 and output, a control-signal generation circuit (not illustrated) inputs a high-level fourth control signal Cont4: High to the switch SW13 and inputs a high-level fifth control signal Cont5: High to the switch SW14. That is, in a split mode using the low-frequency band Band-L, the switches SW13 and SW14 are turned on to increase the capacitance of the second capacitor C2a and the third capacitor C2b.

On the other hand, when the second high-frequency output signal Sout2 in the high-frequency band Band-H is to be branched by the splitter 3 and output, the control-signal generation circuit inputs a low-level fourth control signal Cont4: Low to the switch SW13 and inputs a low-level fifth control signal Cont5: Low to the switch SW14 as illustrated in FIG. 14. That is, in a split mode using the high-frequency band Band-H, the switches SW13 and SW14 are turned off to decrease the capacitance of the second capacitor C2a and the third capacitor C2b.

As described above, in the sixth embodiment, the capacitance of the second capacitor C2a and the third capacitor C2b is increased when a low-frequency band Band-L is used, and the capacitance of the second capacitor C2a and the third capacitor C2b is decreased when a high-frequency band Band-H is used. Due to this change in the capacitance of the second capacitor C2a and the third capacitor C2b, the respective signal characteristics of the splitter 3 for the different frequency bands Band-L and Band-H can be improved as indicated by simulation results described later. Specifically, the S parameters $S_{21}$, $S_{22}$, and $S_{23}$ can be improved in the entire ranges of the low-frequency band Band-L and the high-frequency band Band-H.

In addition to the above configuration, the high-frequency LNAs 2 and 4 in the sixth embodiment further have a different configuration from that in the second embodiment to suppress a difference between an amplitude (that is, power) of the output signals Sout1 and Sout2 in a split mode and an amplitude of the output signals Sout1 and Sout2 in a non-split mode (in the single output mode and in the LNA-1,2 simultaneous operation mode). The configuration of the high-frequency LNAs 2 and 4 different from that in the second embodiment is specifically explained below with reference to FIGS. 15 and 16.

Figure 15:
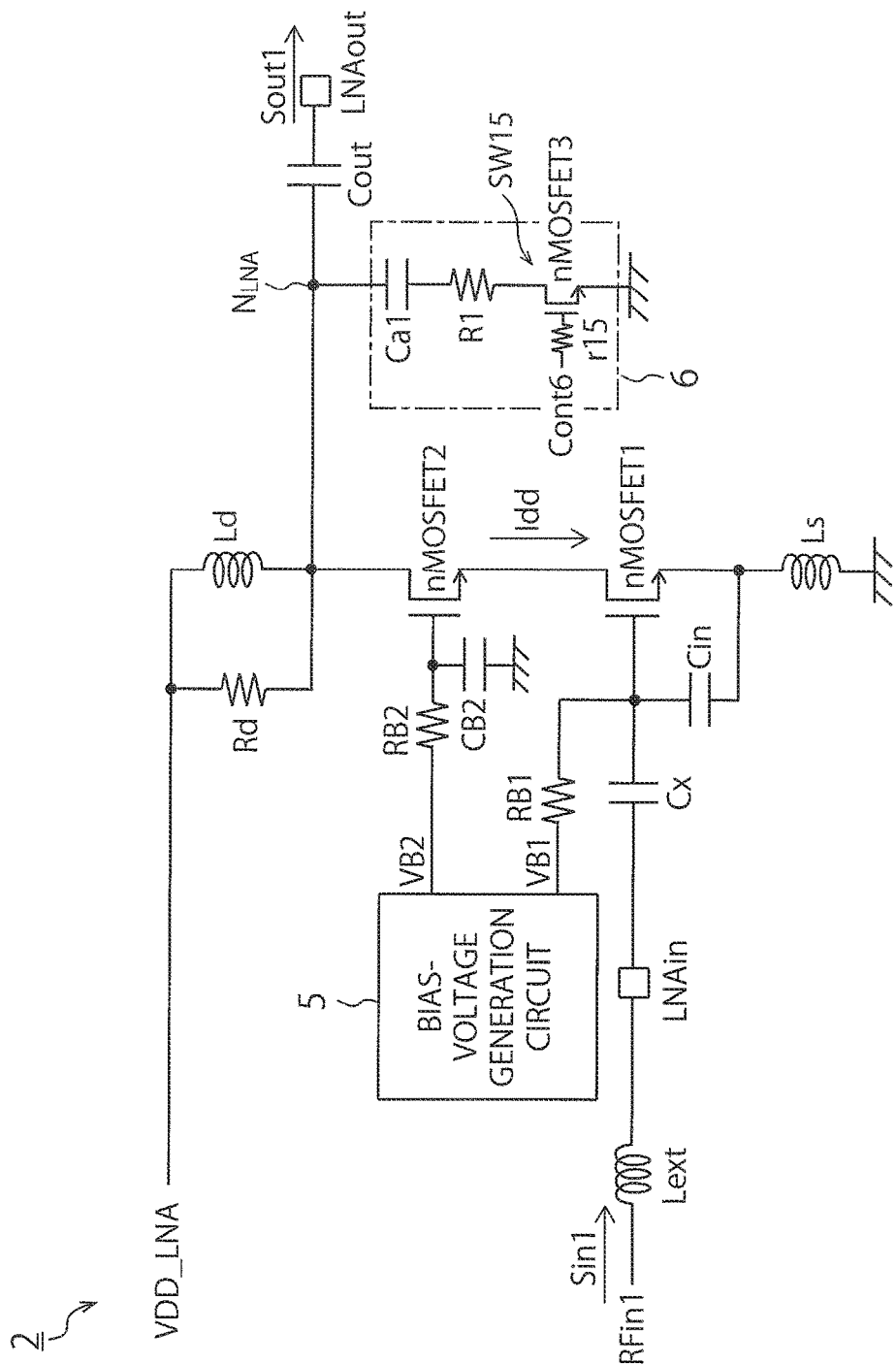
FIG. 15 is a circuit diagram illustrating a high-frequency LNA in the high-frequency semiconductor device according to the sixth embodiment.
Figures 16, 17:
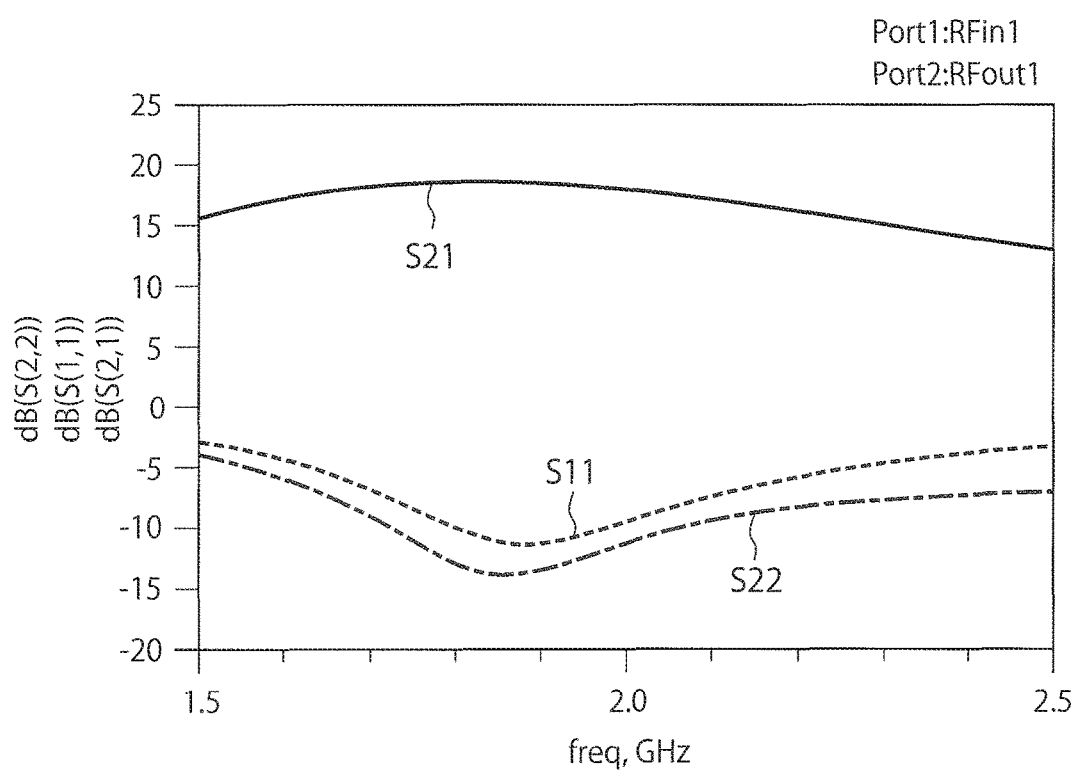
FIG. 16 is a diagram illustrating a correspondence relation among an operation mode, bias voltages of the high-frequency LNA, and a control signal for a gain adjustment circuit in the high-frequency semiconductor device according to the sixth embodiment.
FIG. 17 is a graph indicating small-signal characteristics in a single output mode using a low-frequency band Band-L in a simulation example of the high-frequency semiconductor device according to the sixth embodiment.

FIG. 15 is a circuit diagram illustrating the first high-frequency LNA 2 in the high-frequency semiconductor device 1 according to the sixth embodiment. FIG. 16 is a diagram illustrating a correspondence relation among the operation mode, the bias voltages VB1 and VB2 of the first high-frequency LNA 2, and a control signal for a gain adjustment circuit 6 (described later) in the high-frequency semiconductor device 1 according to the sixth embodiment. While the second high-frequency LNA 4 has an appropriate circuit constant different from that of the first high-frequency LNA 2 to handle a high-frequency band Band-H, the basic configuration thereof is identical to that of the first high-frequency LNA 2. Therefore, in the following explanations, detailed explanations of the second high-frequency LNA 4 are omitted or the configuration of the first high-frequency LNA 2 is used to explain the configuration of the second high-frequency LNA 4 in some cases.

A bias-voltage generation circuit 5 illustrated in FIG. 15 sets a value VB1_split of the bias voltage VB1 input to the gate of the nMOSFET 1 in the split mode to be larger than a value VB1_single of the bias voltage VB1 input to the gate of the nMOSFET 1 in the single output mode as illustrated in FIG. 16. Although not illustrated, the bias-voltage generation circuit 5 can set the value VB1_split of the bias voltage VB1 input to the gate of the nMOSFET 1 in the split mode to be larger than a value of the bias voltage VB1 input to the gate of the nMOSFET 1 in the LNA-1,2 simultaneous operation mode.

In the single output mode in which the splitter 3 is not passed, the amplitude of the output signals Sout1 and Sout2 is maintained from the output terminals LNAout of the high-frequency LNAs 2 and 4 to the output terminals RFout1 and RFout2. However, in the split mode, the output signals Sout1 and Sout2 are split by the splitter 3 and the amplitude is decreased (decreased by half, for example).

If the output signals Sout1 and Sout2 output from the high-frequency LNAs 2 and 4 in the split mode are the same as those in the single output mode, the amplitude of the output signals Sout1 and Sout2 having passed through the splitter 3 is greatly decreased as compared to that in the single output mode. Great decrease of the amplitude may deteriorate receiving sensitivity at a place far from a base station in the split mode (that is, carrier aggregation).

In contrast thereto, according to the sixth embodiment, the value VB1_split of the bias voltage VB1 in the split mode is larger than the value VB1_single of the bias voltage VB1 in the single output mode. The nMOSFET 1 to which the bias voltage VB1 is input operates in an operating range in which the transconductance gm increases to increase a bias current idd as the bias voltage VB1 is increased. Accordingly, the bias current idd in the split mode in which the voltage VB1 is large is larger than the bias current idd in the single output mode in which the bias voltage VB1 is smaller. The larger bias current Idd in the split mode enables the output signals Sout1 and Sout2 in the split mode to be larger than the output signals Sout1 and Sout2 in the single output mode. That is, the driving capacity of the high-frequency LNAs 2 and 4 in the split mode can be increased relative to that in the single output mode. Accordingly, a difference between the amplitude of the output signals Sout1 and Sout2 having passed through the splitter 3 in the split mode and the amplitude of the output signals Sout1 and Sout2 in the signal output mode can be suppressed and thus deterioration in the receiving sensitivity in the split mode can be suppressed.

In addition to the above configuration, the bias-voltage generation circuit 5 further sets a value VB2_split of the bias voltage VB2 input to the gate of the nMOSFET 2 in the split mode to be larger than a value VB2_single of the bias voltage VB2 input to the gate of the nMOSFET 2 in the single output mode in the sixth embodiment as illustrated in FIG. 16.

Setting the value VB2_split to be larger than the value VB2_single enables a voltage between the drain and the source of the nMOSFET 1 to be fixed in the single output mode and the split mode. Accordingly, deviation of a bias point from an ideal state can be suppressed and the output signals Sout1 and Sout2 with desired amplitude can be obtained.

In addition to the above configuration, the high-frequency LNAs 2 and 4 each further include the gain adjustment circuit 6 illustrated in FIG. 15 in the sixth embodiment. The gain adjustment circuit 6 adjusts gain of the high-frequency LNAs 2 and 4 in the non-split mode to a value smaller than that of the high-frequency LNAs 2 and 4 in the split mode.

In the example illustrated in FIG. 15, the gain adjustment circuit 6 includes a capacitor Ca1, a resistor R1, and a switch SW15 connected in series between a node $N_{LNA}$ between the drain of the nMOSFET 2 and the output terminal LNAout, and the ground potential. The switch SW15 includes an nMOSFET 3, and a resistor r15 connected to a gate of the nMOSFET 3. The switch SW15 is controlled to be on/off by a sixth control signal Cont6 input to the gate of the nMOSFET 3 via the resistor r15. When the switch SW15 is turned on, the gain adjustment circuit 6 is connected to the node $N_{LNA}$ to decrease the gain of the high-frequency LNAs 2 and 4. On the other hand, when the switch SW15 is turned off, the gain adjustment circuit 6 is disconnected from the node $N_{LNA}$ to increase the gain of the high-frequency LNAs 2 and 4.

As illustrated in FIG. 16, the generation circuit for the control signal inputs the sixth control signal Cont6 of a high level to the gate of the nMOSFET 3 to turn on the switch SW15, so that the gain of the high-frequency LNAs 2 and 4 in the single output mode is decreased. On the other hand, in the split mode, the generation circuit for the control signal inputs the sixth control signal Cont6 of a low level to the gate of the nMOSFET 3 to turn off the switch SW15, so that the gain of the high-frequency LNAs 2 and 4 is increased.

As described above, the value of the bias voltage VB1 is increased in the split mode to increase the driving capacity of the high-frequency LNAs 2 and 4, so that the amplitude of the output signals Sout1 and Sout2 becomes larger than that in the single output mode.

In the split mode, however, an ideal driving capacity of the high-frequency LNAs 2 and 4 is not always expected and the driving capacity thereof may be lower than the ideal value.

With the gain adjustment circuit 6, the amplitude of the output signals Sout1 and Sout2 in the single output mode can be decreased by decreasing the gain in the single output mode in anticipation of cases where an ideal driving capacity is not obtained in the split mode. Accordingly, a difference between the amplitude of the output signals Sout1 and Sout2 in the split mode and the amplitude of the output signals Sout1 and Sout2 in the single output mode can be suppressed more reliably.

The gain adjustment circuit 6 can be used to improve an output return loss ($S_{22}$) of the high-frequency LNAs 2 and 4 when the output terminal LNAout is the port 2.

A simulation example of the high-frequency semiconductor device 1 having the above configuration according to the sixth embodiment is explained next.

In simulations, signal characteristics of each of the first high-frequency output signal Sout1 in the low-frequency band Band-L from the first high-frequency LNA 2 and the second high-frequency output signal Sout2 in the high-frequency band Band-H from the second high-frequency LNA 4 were measured in two modes of the single output mode and the split mode.

Specifically, in the single output mode, the S parameters $S_{21}$, $S_{11}$, and $S_{22}$ were measured using the first input terminal RFin1 as the port 1 and the first output terminal RFout1 as the port 2. In the split mode, the S parameter $S_{23}$ was further measured in addition to the S parameters $S_{21}$, $S_{11}$, and $S_{22}$ using the second output terminal RFout2 as the port 3.

In the simulations, the power-supply potential VDD_LNA of the high-frequency LNAs 2 and 4 was 1.8 volts.

In a simulation of the split mode using the first high-frequency output signal Sout1 in the low-frequency band Band-L, the switches SW13 and SW14 were turned on to set the capacitance of the second capacitor C2a and the third capacitor C2b to a large value. Meanwhile, in a simulation of the split mode using the second high-frequency output signal Sout2 in the high-frequency band Band-H, the switches SW13 and SW14 were turned off to set the capacitance of the second capacitor C2a and the third capacitor C2b to a small value.

The value VB1_split of the bias voltage VB1 input to the gate of the nMOSFET 1 in the simulation of the spilt mode was set to be larger than the value VB1_single of the bias voltage VB1 input to the gate of the nMOSFET 1 in the simulation of the single output mode. The value VB2_split of the bias voltage VB2 input to the gate of the nMOSFET 2 in the simulation of the split mode was set to be larger than the value VB2_single of the bias voltage VB2 input to the gate of the nMOSFET 2 in the simulation of the single output mode.

In the simulation of the single output mode, the switch SW15 of the gain adjustment circuit 6 was turned on to set the gain of the high-frequency LNAs 2 and 4 to a small value. On the other hand, in the simulation of the split mode, the switch SW15 was turned off to set the gain of the high-frequency LNAs 2 and 4 to a large value.

Other conditions in the simulations were identical to those in FIGS. 9A to 9D. Results of the simulations are illustrated in FIGS. 17 to 21.

Figure 18:
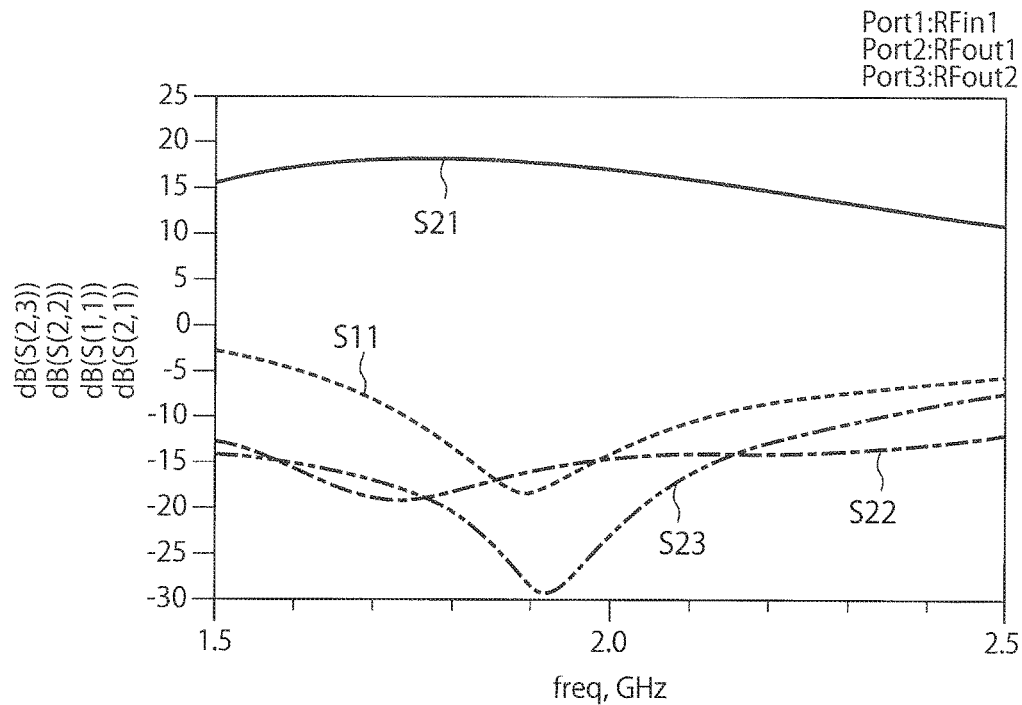
FIG. 18 is a graph indicating small-signal characteristics in a split output mode using the low-frequency band Band-L in the simulation example of the high-frequency semiconductor device according to the sixth embodiment.
Figure 19:
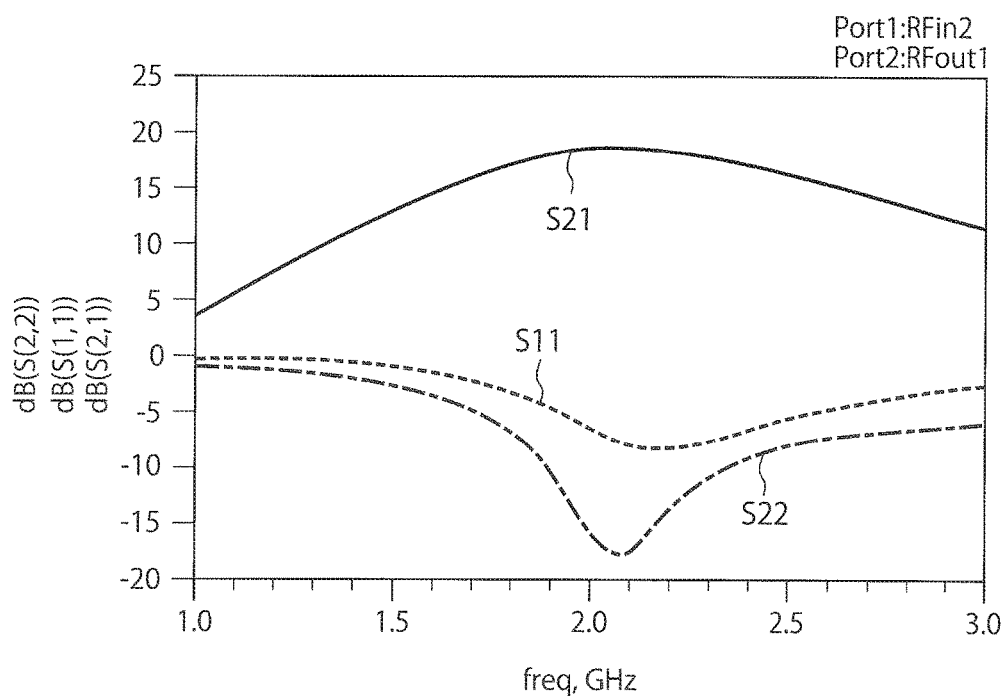
FIG. 19 is a graph indicating small-signal characteristics in a single output mode using a high-frequency band Band-H in the simulation example of the high-frequency semiconductor device according to the sixth embodiment.
Figure 20:
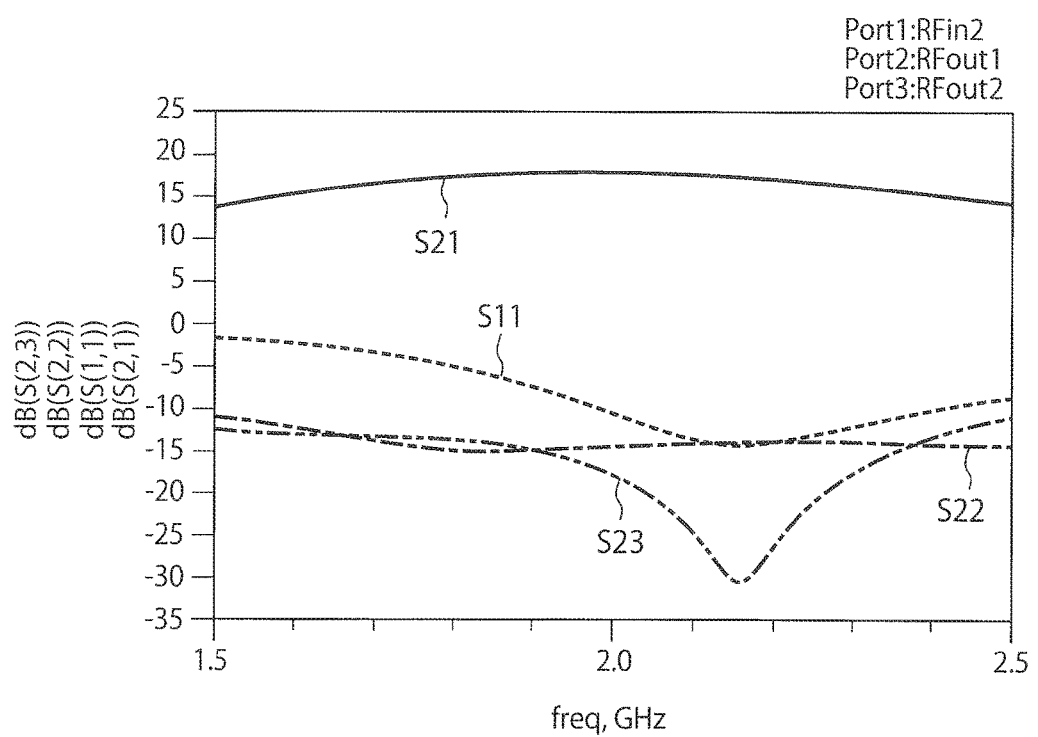
FIG. 20 is a graph indicating small-signal characteristics in a split mode using the high-frequency band Band-H in the simulation example of the high-frequency semiconductor device according to the sixth embodiment.

FIG. 17 is a graph indicating small-signal characteristics in the single output mode using the low-frequency band Band-L in the simulation example of the high-frequency semiconductor device 1 according to the sixth embodiment. FIG. 18 is a graph indicating small-signal characteristics in the split mode using the low-frequency band Band-L in the simulation example of the high-frequency semiconductor device 1 according to the sixth embodiment. FIG. 19 is a graph indicating small-signal characteristics in the single output mode using the high-frequency band Band-H in the simulation example of the high-frequency semiconductor device 1 according to the sixth embodiment. FIG. 20 is a graph indicating small-signal characteristics in the split mode using the high-frequency band Band-H in the simulation example of the high-frequency semiconductor device 1 according to the sixth embodiment. FIG. 21 is a diagram illustrating a list of representative values in the graphs of FIGS. 17 to 20 in the simulation example of the high-frequency semiconductor device 1 according to the sixth embodiment.

As illustrated in FIGS. 17 and 21, as for the small-signal characteristics in the single output mode using the low-frequency band Band-L, the S parameters $S_{22}$ and $S_{11}$ had minimum values smaller than −11 dB and the S parameter $S_{21}$ had a maximum value larger than 18 dB near 1915 MHz being the center frequency of the low-frequency band Band-L. Also at 1805 MHz being the minimum frequency and 2025 MHz being the maximum frequency in the low-frequency band Band-L, the S parameter $S_{22}$ was smaller than −10 dB, the S parameter $S_{11}$ was smaller than −8 dB, and the S parameter $S_{21}$ was larger than 17 dB. It can be said that this simulation result illustrated in FIGS. 17 and 21 is a satisfactory result in which the gain ($S_{21}$) was large, and the input return loss ($S_{11}$) and the output return loss ($S_{22}$) were sufficiently suppressed in the entire range of the low-frequency band Band-L. Furthermore, as illustrated in FIG. 21, IP 1 dB (1-dB compression point) was −16.0 dB and a satisfactory result was also obtained for large-signal characteristics.

As illustrated in FIGS. 18 and 21, as for the small-signal characteristics in the split mode using the low-frequency band Band-L, the S parameter $S_{23}$ had a minimum value smaller than −29 dB, the S parameter $S_{11}$ had a minimum value smaller than −18 dB, the S parameter $S_{22}$ was smaller than −15 dB, and the S parameter $S_{21}$ was larger than 17 dB near 1915 MHz as the center frequency of the low-frequency band Band-L. Also at 1805 MH as the minimum frequency and 2025 MHz as the maximum frequency of the low-frequency band Band-L, the S parameter $S_{23}$ was smaller than −20 dB, the S parameter $S_{11}$ was equal to or smaller than −13 dB, the S parameter $S_{22}$ was smaller than −14 dB, and the S parameter $S_{21}$ was larger than 16 dB. It can be said that this simulation result in FIGS. 18 and 21 is a satisfactory result in which the gain ($S_{21}$) was large, the input return loss ($S_{11}$) and the output return loss ($S_{22}$) were sufficiently suppressed, and the isolation ($S_{23}$) was sufficiently provided in the entire range of the low-frequency band Band-L. As illustrated in FIG. 21, IP 1 dB was −15.5 dB and a satisfactory result was obtained also for large-signal characteristics.

As illustrated in FIGS. 19 and 21, as for the small-signal characteristics in the single output mode using the high-frequency band Band-H, the S parameter $S_{22}$ had a minimum value smaller than −15 dB, the S parameter $S_{11}$ had a minimum value smaller than −8 dB, and the S parameter $S_{21}$ had a maximum value larger than 18 dB near 2155 MHz being the center frequency of the high-frequency band Band-H. Also at 2110 MHz being the minimum frequency and 2200 MHz being the maximum frequency in the high-frequency band Band-H, the S parameter $S_{22}$ was smaller than −13 dB, the S parameter $S_{11}$ was smaller than −8 dB, and the S parameter $S_{21}$ was larger than 18 dB. It can be said that this simulation result of FIGS. 19 and 21 is a satisfactory result in which the gain ($S_{21}$) was large, and the input return loss ($S_{11}$) and the output return loss ($S_{22}$) were sufficiently suppressed in the entire range of the high-frequency band Band-H. As illustrated in FIG. 21, IP 1 dB was −15.4 dB and a satisfactory result was obtained also for large-signal characteristics.

As illustrated in FIGS. 20 and 21, as for the small-signal characteristics in the split mode using the high-frequency band Band-H, the S parameter $S_{23}$ had a minimum value smaller than −30 dB, the S parameter $S_{11}$ had a minimum value smaller than −14 dB, the S parameter $S_{22}$ was smaller than −13 dB, and the S parameter $S_{21}$ was larger than 17 dB near 2155 MHz being the center frequency of the high-frequency band Band-H. Also at 2110 MHz being the minimum frequency and 2200 MHz being the maximum frequency in the high-frequency band Band-H, the S parameter $S_{23}$ was smaller than −25 dB, the S parameter $S_{11}$ was equal to or smaller than −13 dB, the S parameter $S_{22}$ was smaller than −13 dB, and the S parameter $S_{21}$ was larger than 17 dB. It can be said that this simulation result of FIGS. 20 and 21 is a satisfactory result in which the gain ($S_{21}$) was large, the input return loss ($S_{11}$) and the output return loss ($S_{22}$) were sufficiently suppressed, and the isolation ($S_{23}$) was sufficiently provided in the entire range of the high-frequency band Band-H. As illustrated in FIG. 21, IP 1 dB was −14.2 dB and a satisfactory result was obtained also for the large-signal characteristics.

According to the sixth embodiment, the signal characteristics in the entire ranges of the low-frequency band Band-L and the high-frequency band Band-H can be improved by switching the capacitance of the variable capacitors C2a and C2b by the splitter 3 between the case where the first high-frequency output signal Sout1 in the low-frequency band Band-L is output and the case where the second high-frequency output signal Sout2 in the high-frequency band Band-H is output. Therefore, robustness in a wideband use can be enhanced.

Furthermore, according to the sixth embodiment, the output signals Sout1 and Sout2 in the split mode can be set to be larger than the output signals Sout1 and Sout2 in the single output mode by setting the bias voltage VB1 in the split mode to be larger than the bias voltage VB1 in the single output mode. Accordingly, a difference between the amplitude of the output signals Sout1 and Sout2 having passed through the splitter 3 in the split mode and the amplitude of the output signals Sout1 and Sout2 in the single output mode can be suppressed to suppress deterioration in the receiving sensitivity in the split mode.

(Seventh Embodiment)

Figures 22, 23:
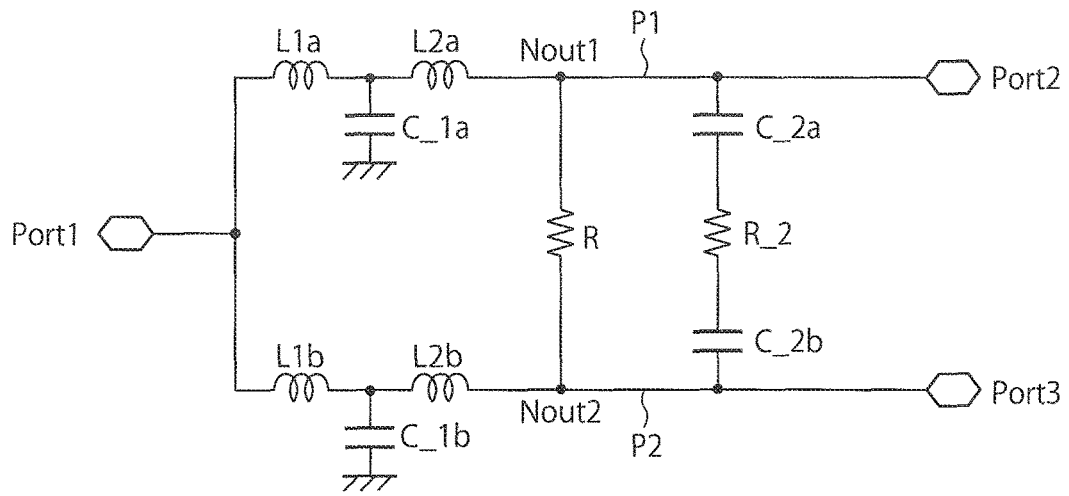
FIG. 22 is a circuit diagram illustrating a splitter according to a seventh embodiment.
FIG. 23 is a diagram illustrating circuit constants in a simulation example of the splitter according to the seventh embodiment.

A seventh embodiment to improve signal characteristics in a wide band is explained next. FIG. 22 is a circuit diagram illustrating the splitter 3 according to the seventh embodiment.

As illustrated in FIG. 22, the splitter 3 according to the seventh embodiment includes a resistor R_2 being an example of a second resistor and capacitors C_2a and C_2b, in addition to the resistor R (the first resistor) connected between the first output node Nout1 and the second output node Nout2 illustrated in FIG. 1. The resistor and the capacitors C_2a and C_2b are connected in series between the first output node Nout1 and the second output node Nout2. More specifically, the capacitor C_2a is connected between the first output node Nout1 and the resistor R_2. The capacitor C_2b is connected between the resistor R_2 and the second output node Nout2. The capacitors C_2a and C_2b have a same capacitance. A reason why the capacitors C_2a, the resistor R_2, and the capacitor C_2b are connected in series in this order is to keep symmetry in the layout.

Inclusion of the resistor R_2 and the capacitors C_2a and C_2b can improve signal characteristics in a wide band as indicated by a following simulation result. To improve the signal characteristics in a wide band, the resistance value of the resistor R_2 is preferably smaller than the resistance value of the resistor R. It is preferable that the resistance value of the resistor R be larger than 100 Ω.

A capacitor C_1a having one end connected between the first spiral inductor L1a and the second spiral inductor L2a in FIG. 22 has the same configuration as that of the second capacitor C2a in FIG. 1 although having a different reference sign. A capacitor C_1b having one end connected between the third spiral inductor L1b and the fourth spiral inductor L2b has the same configuration as that of the third capacitor C2b in FIG. 1 although having a different reference sign.

A simulation result of the splitter 3 having the above configuration in the seventh embodiment is explained next.

FIG. 23 is a diagram illustrating circuit constants in the simulation result of the splitter 3 according to the seventh embodiment. In simulations, the S parameters $S_{21}$, $S_{11}$, $S_{22}$, and $S_{23}$ were measured in the splitter 3 having the configuration of FIG. 22, to which the circuit constants shown in an "example" of FIG. 23 were set. In the simulations, the S parameters $S_{21}$, $S_{11}$, $S_{22}$, and $S_{23}$ were also measured in a splitter 3 having a similar configuration to that of FIG. 1, to which the circuit constants shown in a "comparison example" of FIG. 23 were set. For the measurement, the port 1 was set as the input node of the splitter 3 as in the case illustrated in FIGS. 9A to 9D. The port 2 was set as the output terminal of the splitter 3 on the side of the first signal path P1. The port 3 was set as the output terminal of the splitter 3 on the side of the second signal path P2.

In the simulations, signals in a frequency band so-called "high band" from 2300 MHz to 2690 MHz were used. Parasitic resistances of the inductors L1a, L1b, L2a, and L2b in the simulations were set to the same values as the inductances of the inductors L1a, L1b, L2a, and L2b, where the unit was changed to Ω. For example, while the inductances of the first spiral inductor L1a and the third spiral inductor L1b in the comparative example were 4.65 nH, the parasitic resistances thereof were 4.65 Ω. The simulation result is illustrated in FIGS. 24 to 26.

Figure 24:
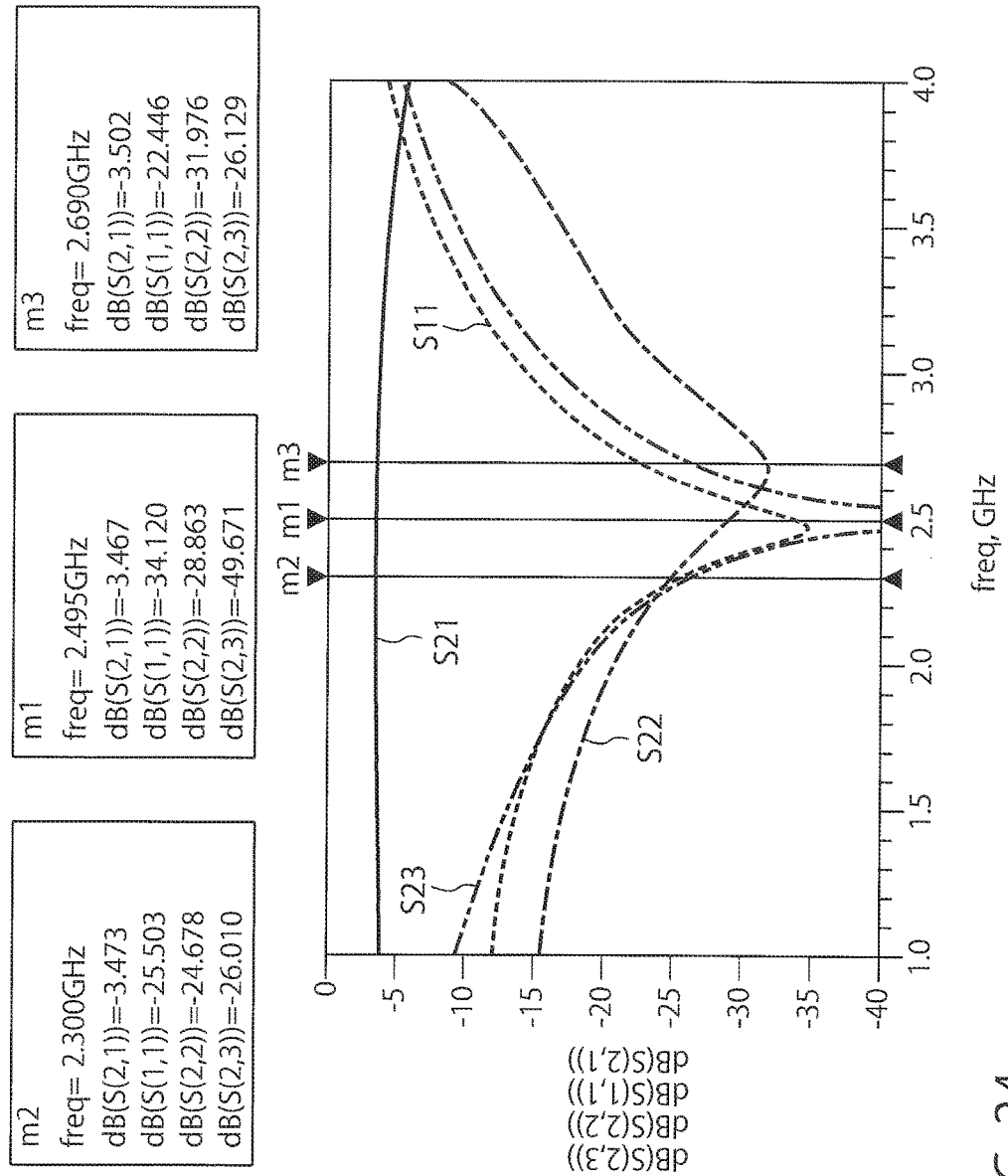
FIG. 24 is a graph indicating frequency characteristics in the simulation example of the splitter according to the seventh embodiment.

FIG. 24 is a graph indicating frequency characteristics in the simulation example of the splitter 3 according to the seventh embodiment. FIG. 25 is a graph indicating frequency characteristics in the simulation example of the splitter 3 according to the comparison example of the seventh embodiment. FIG. 26 is a diagram illustrating a list of worst values within a band in the graphs of FIGS. 24 and 25 in the simulation example of the splitter 3 according to the seventh embodiment.

Figures 26, 27:
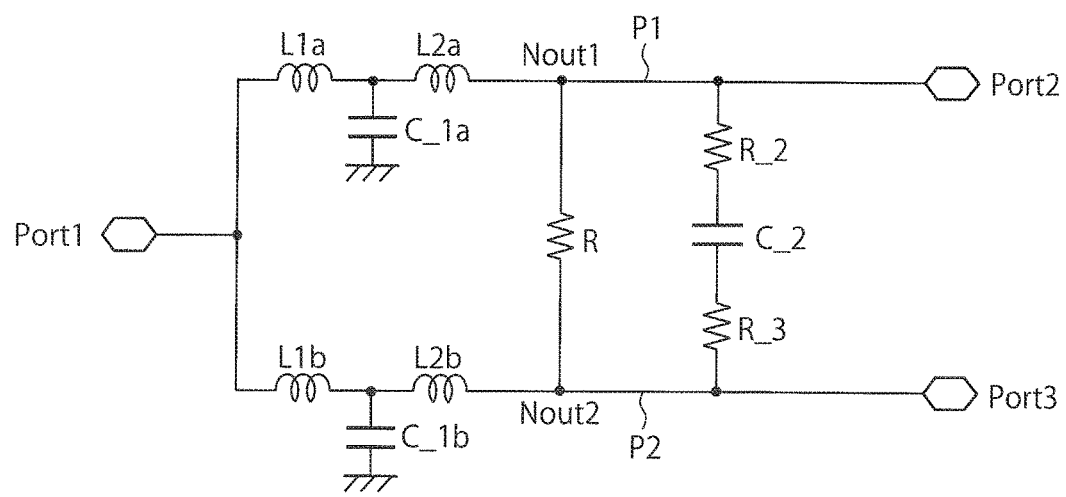
FIG. 26 is a diagram illustrating a list of worst values within a band in the graphs of FIGS. 24 and 25 in the simulation example of the splitter according to the seventh embodiment.
FIG. 27 is a circuit diagram illustrating a splitter according to a first modification of the seventh embodiment.

As indicated by the "example" in FIGS. 24 and 26, the worst value (the minimum value) of the S parameter $S_{21}$ was larger than −3.5 dB, the worst value (the maximum value) of the S parameter $S_{11}$ was smaller than −22 dB, the worst value (the maximum value) of the S parameter $S_{22}$ was smaller than −24 dB, and the worst value (the maximum value) of the S parameter $S_{23}$ was smaller than −26 dB in the frequency band (2300 MHz to 2690 MHz) in the splitter 3 according to the seventh embodiment.

Figure 25:
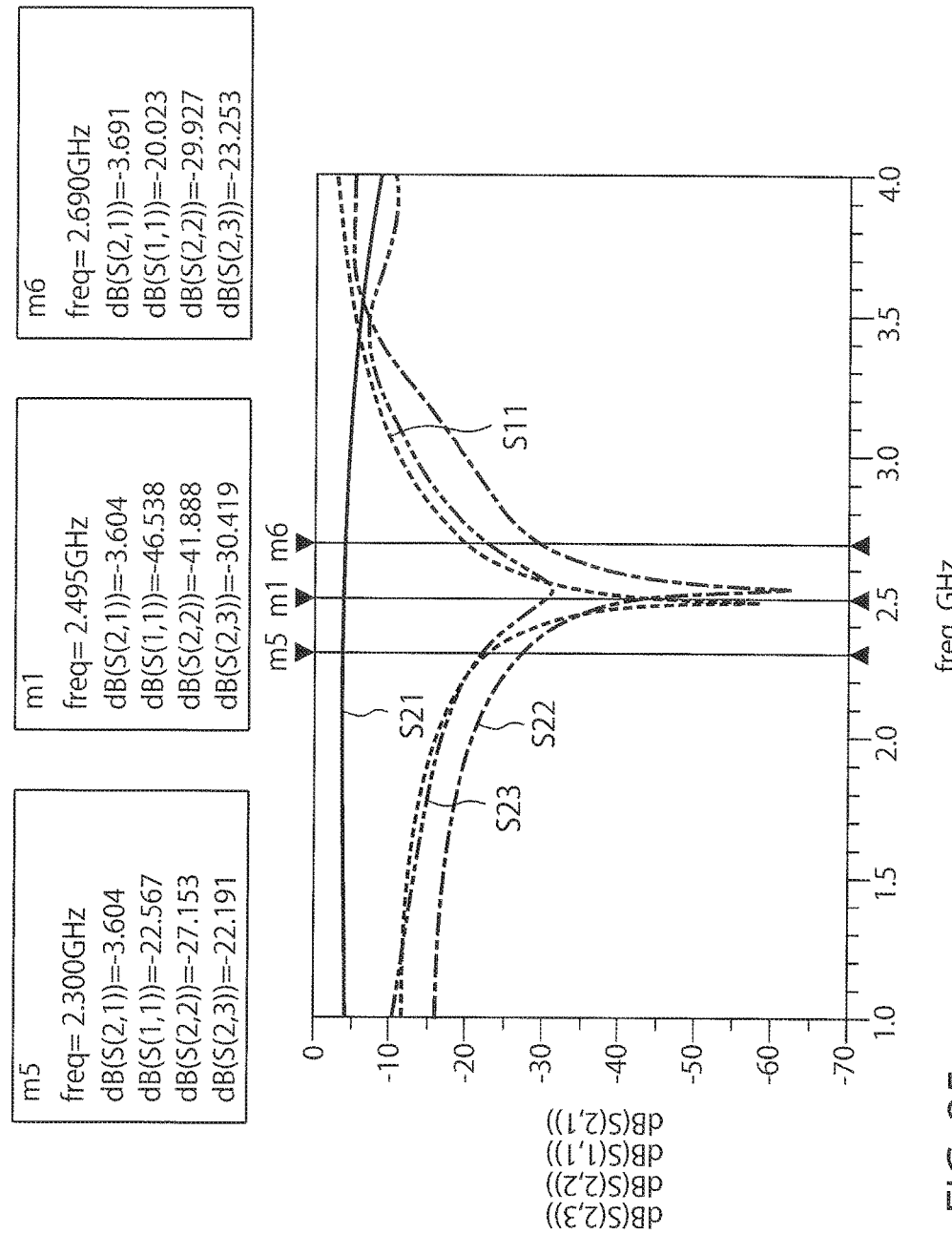
FIG. 25 is a graph indicating frequency characteristics in a simulation example of a splitter according to a comparison example of the seventh embodiment.

On the other hand, as indicated by the "comparative example" in FIGS. 25 and 26, the worst value (the minimum value) of the S parameter $S_{21}$ was smaller than −3.6 dB, the worst value (the maximum value) of the S parameter $S_{11}$ was larger than −20 dB, the worst value (the maximum value) of the S parameter $S_{22}$ was smaller than −27 dB, and the worst value (the maximum value) of the S parameter $S_{23}$ was larger than −22 dB in the frequency band (2300 MHz to 2690 MHz) in the splitter 3 according to the comparative example.

As illustrated in FIG. 26, the example is better in the S parameter $S_{21}$ by 0.1 dB than the comparative example. This is because the values of the inductors are smaller and correspondingly the parasitic resistances are smaller. The example is greatly improved in the S parameter $S_{23}$ relative to the comparative example and is improved by 3.8 dB relative to the comparative example. While deteriorated by 2.5 dB relative to that of the comparative example, the S parameter $S_{22}$ of the example has a sufficient margin from −20 dB, which is a generally required value.

From the above simulation result, it is confirmed that the splitter 3 according to the seventh embodiment is better in provision of the gain and the isolation in the case of using a wide band (2300 MHz to 2690 MHz), and can suppress the return loss to such an extent that does not practically cause a problem relative to the splitter 3 according to the comparative example.

According to the seventh embodiment, signal characteristics in a wide band can be improved in the high-frequency semiconductor device 1 including the splitter 3 having narrowband characteristics in principle.

Figure 28:
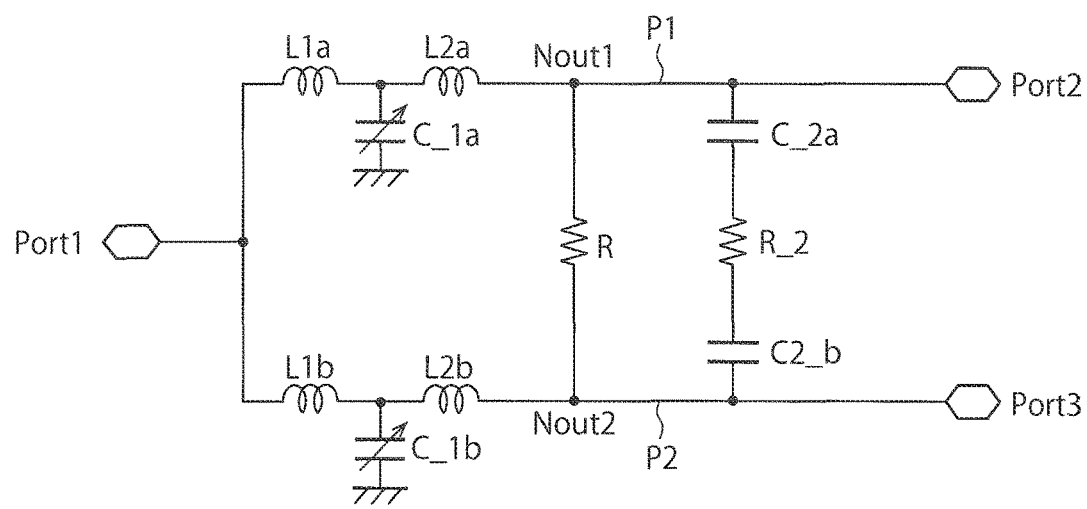
FIG. 28 is a circuit diagram illustrating a splitter according to a second modification of the seventh embodiment.

Modifications of the splitter 3 according to the seventh embodiment are explained next. FIG. 27 is a circuit diagram illustrating the splitter 3 according to a first modification of the seventh embodiment. FIG. 28 is a circuit diagram illustrating the splitter 3 according to a second modification of the seventh embodiment.

In the example of FIG. 22, the capacitor C_2a, the resistor R_2, and the capacitor C_2b are connected in series in this order between the first output node Nout1 and the second output node Nout2 to improve wideband signal characteristics. In contrast thereto, the resistor R_2, a capacitor C_2, and a resistor R_3 can be connected in series in this order between the first output node Nout1 and the second output node Nout2 as illustrated in FIG. 27. In this case, it is desirable that the resistors R_2 and R_3 have a same resistance value to ensure symmetry of the layout. Improvement in the wideband signal characteristics is expected also in the example of FIG. 27. The splitter 3 according to the seventh embodiment can be applied to the high-frequency semiconductor devices 1 according to the first to sixth embodiments. For example, to apply the splitter 3 according to the seventh embodiment to the sixth embodiment, the capacitors C_1a and C_1b can be changed to variable capacitors as illustrated in FIG. 28.

(Eighth Embodiment)

Figure 29:
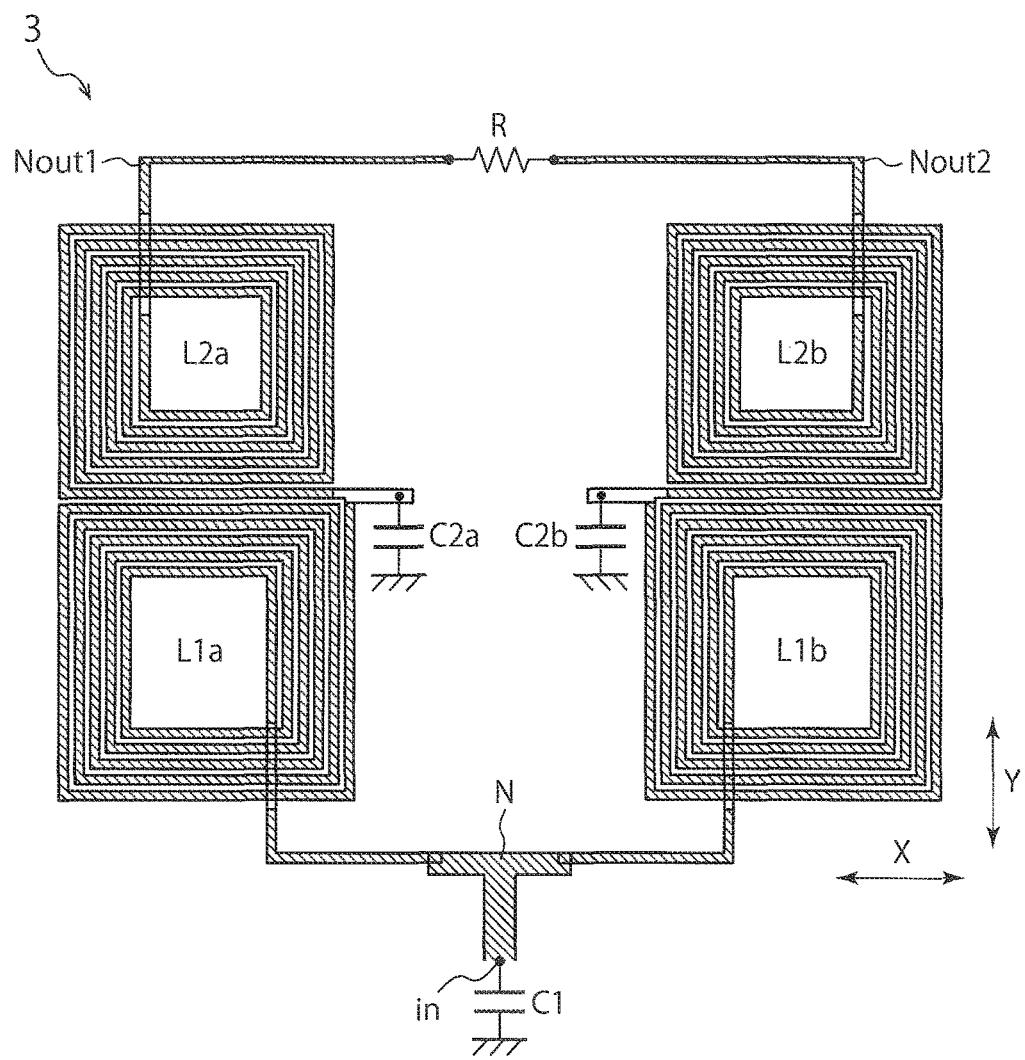
FIG. 29 is a layout diagram of a splitter in a high-frequency semiconductor device according to an eighth embodiment.

An example of a layout of the splitter 3 different from that in FIG. 8 is explained next as an eighth embodiment. FIG. 29 is a layout diagram of the splitter 3 in the high-frequency semiconductor device 1 according to the eighth embodiment.

In the example of FIG. 8, all the spiral inductors L1a, L2a, L1b, and L2b are arranged linearly along the X direction. In contrast thereto, the second spiral inductor L2a can be arranged in the Y direction with respect to the first spiral inductor L1a and the fourth spiral inductor L2b can be arranged in the Y direction with respect to the third spiral inductor L1b and in the X direction with respect to the second spiral inductor L2a as illustrated in FIG. 29.

Because the spiral inductors L1a, L2a, L1b, and L2b are laid out to have a positive coupling coefficient also in the eighth embodiment, the inductance required for the splitter 3 can be ensured while the size is suppressed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
an amplifier amplifying an input signal;
a splitter branching an output signal of the amplifier into a first signal path and a second signal path and performing impedance conversion of the first and second signal paths;
a first output terminal outputting the output signal of the amplifier or a signal obtained by branching the output signal of the amplifier into the first signal path by the splitter;
a second output terminal outputting the output signal of the amplifier or a signal obtained by branching the output signal of the amplifier into the second signal path by the splitter;
an output controller switching whether the output signal of the amplifier is output from the first output terminal, is output from the second output terminal, or is branched by the splitter to be output from both the first and second output terminals; and
an SOI (Silicon On Insulator) substrate having the amplifier, the splitter, and the output controller placed thereon, wherein
the output controller comprises:
a first switch connected between an output node of the amplifier and an input node of the splitter;
a second switch connected between the first signal path and the first output terminal;
a third switch connected between the second signal path and the second output terminal;
a fourth switch connected between the output node of the amplifier and the first output terminal; and
a fifth switch connected between the output node of the amplifier and the second output terminal, and
the output controller switches whether the output signal of the amplifier is output from the first output terminal, is output from the second output terminal, or is branched by the splitter to be output from both the first and second output terminals, by switching control of the first to fifth switches.

2. A semiconductor device comprising:
an amplifier amplifying input signals;
a splitter branching an output signal of the amplifier into a first signal path and a second signal path and performing impedance conversion of the first and second signal paths;
a first output terminal outputting the output signal of the amplifier or a signal obtained by branching the output signal of the amplifier into the first signal path by the splitter;
a second output terminal outputting the output signal of the amplifier or a signal obtained by branching the output signal of the amplifier into the second signal path by the splitter;
an output controller switching whether the output signal of the amplifier is output from the first output terminal, is output from the second output terminal, or is branched by the splitter to be output from both the first and second output terminals; and
an SOI (Silicon On Insulator) substrate having the amplifier, the splitter, and the output controller placed thereon, wherein
the amplifier comprises a first amplifier amplifying a first input signal, and a second amplifier amplifying a second input signal, and
the output controller switches whether an output signal of the first amplifier is output from the first output terminal, is output from the second output terminal, or is branched by the splitter to be output from both the first and second output terminals, and switches whether an output signal of the second amplifier is output from the first output terminal, is output from the second output terminal, or is branched by the splitter to be output from both the first and second output terminals.

3. The device of claim 2, wherein
the output controller comprises:
a first switch connected between an output node of the first amplifier and an input node of the splitter;

a second switch connected between the first signal path and the first output terminal;
a third switch connected between the second signal path and the second output terminal;
a fourth switch connected between the output node of the first amplifier and the first output terminal;
a fifth switch connected between the output node of the first amplifier and the second output terminal;
a sixth switch connected between an output node of the second amplifier and the input node of the splitter;
a seventh switch connected between the output node of the second amplifier and the first output terminal;
an eighth switch connected between the output node of the second amplifier and the second output terminal;
a ninth switch connected between the first amplifier and the output node of the first amplifier; and
a tenth switch connected between the second amplifier and the output node of the second amplifier, and
the output controller switches whether an output signal of the first amplifier is output from the first output terminal, is output from the second output terminal, or is branched by the splitter to be output from both the first and second output terminals, and switches whether an output signal of the second amplifier is output from the first output terminal, is output from the second output terminal, or is branched by the splitter to be output from both the first and second output terminals, by switching control of the first to tenth switches.

4. A semiconductor device comprising:
an amplifier amplifying input signals;
a splitter branching an output signal of the amplifier into a first signal path and a second signal path and performing impedance conversion of the first and second signal paths;
a first output terminal outputting the output signal of the amplifier or a signal obtained by branching the output signal of the amplifier into the first signal path by the splitter;
a second output terminal outputting the output signal of the amplifier or a signal obtained by branching the output signal of the amplifier into the second signal path by the splitter;
an output controller switching whether the output signal of the amplifier is output from the first output terminal, is output from the second output terminal, or is branched by the splitter to be output from both the first and second output terminals; and
an SOI (Silicon On Insulator) substrate having the amplifier, the splitter, and the output controller placed thereon, wherein
the amplifier comprises a first amplifier amplifying a first input signal, a second amplifier amplifying a second input signal, and a third amplifier amplifying a third input signal, and
the output controller switches whether an output signal of the first amplifier is output from the first output terminal, is output from the second output terminal, or is branched by the splitter to be output from both the first and second output terminals, switches whether an output signal of the second amplifier is output from the first output terminal, is output from the second output terminal, or is branched by the splitter to be output from both the first and second output terminals, and switches whether an output signal of the third amplifier is output from the first output terminal or is output from the second output terminal.

5. The device of claim 4, wherein
the output controller comprises:
a first switch connected between an output node of the first amplifier and an input node of the splitter;
a second switch connected between the first signal path and the first output terminal;
a third switch connected between the second signal path and the second output terminal;
a fourth switch connected between the output node of the first amplifier and the first output terminal;
a fifth switch connected between the output node of the first amplifier and the second output terminal;
a sixth switch connected between an output node of the second amplifier and the input node of the splitter;
a seventh switch connected between the output node of the second amplifier and the first output terminal;
an eighth switch connected between the output node of the second amplifier and the second output terminal;
a ninth switch connected between the first amplifier and the output node of the first amplifier;
a tenth switch connected between the second amplifier and the output node of the second amplifier;
an eleventh switch connected between an output node of the third amplifier and the first output terminal; and
a twelfth switch connected between the output node of the third amplifier and the second output terminal, and
the output controller switches whether an output signal of the first amplifier is output from the first output terminal, is output from the second output terminal, or is branched by the splitter to be output from both the first and second output terminals, switches whether an output signal of the second amplifier is output from the first output terminal, is output from the second output terminal, or is branched by the splitter to be output from both the first and second output terminals, and switches whether an output signal of the third amplifier is output from the first output terminal or is output from the second output terminal, by switching control of the first to twelfth switches.

6. A semiconductor device comprising:
an amplifier amplifying input signals;
a splitter branching an output signal of the amplifier into a first signal path and a second signal path and performing impedance conversion of the first and second signal paths;
a first output terminal outputting the output signal of the amplifier or a signal obtained by branching the output signal of the amplifier into the first signal path by the splitter;
a second output terminal outputting the output signal of the amplifier or a signal obtained by branching the output signal of the amplifier into the second signal path by the splitter;
an output controller switching whether the output signal of the amplifier is output from the first output terminal, is output from the second output terminal, or is branched by the splitter to be output from both the first and second output terminals; and
an SOI (Silicon On Insulator) substrate having the amplifier, the splitter, and the output controller placed thereon, wherein
the splitter comprises:
a first inductor and a second inductor connected in series on the first signal path; and a third inductor and a fourth inductor connected in series on the second signal path, and the first to fourth inductors are spiral conductive patters arranged on the SOI substrate, wherein the amplifier comprises a fifth inductor, a first transistor, a second transistor, and a sixth inductor connected in series between a first reference potential and a second reference potential, the input signal is input to a gate of the first transistor, a bias voltage is input to a gate of the second transistor, a signal corresponding to a drain voltage of the second transistor is output from an output node of the amplifier, a line width of the fifth inductor is larger than that of the first to fourth inductors, and a line width of the sixth inductor is smaller than that of the first to fourth inductors.

7. The device of claim 1, wherein
the splitter comprises:
a first inductor and a second inductor connected in series on the first signal path; and
a third inductor and a fourth inductor connected in series on the second signal path, and
the first to fourth inductors are spiral conductive patters arranged on the SOI substrate.

8. The device of claim 2, wherein
the splitter comprises:
a first inductor and a second inductor connected in series on the first signal path; and
a third inductor and a fourth inductor connected in series on the second signal path, and
the first to fourth inductors are spiral conductive patters arranged on the SOI substrate.

9. The device of claim 3, wherein
the splitter comprises:
a first inductor and a second inductor connected in series on the first signal path; and
a third inductor and a fourth inductor connected in series on the second signal path, and
the first to fourth inductors are spiral conductive patters arranged on the SOI substrate.

10. The device of claim 4, wherein
the splitter comprises:
a first inductor and a second inductor connected in series on the first signal path; and
a third inductor and a fourth inductor connected in series on the second signal path, and
the first to fourth inductors are spiral conductive patters arranged on the SOI substrate.

11. The device of claim 5, wherein
the splitter comprises:
a first inductor and a second inductor connected in series on the first signal path; and
a third inductor and a fourth inductor connected in series on the second signal path, and
the first to fourth inductors are spiral conductive patters arranged on the SOI substrate.

12. A semiconductor device comprising:
an amplifier amplifying input signals;
a splitter branching an output signal of the amplifier into a first signal path and a second signal path and performing impedance conversion of the first and second signal paths;
a first output terminal outputting the output signal of the amplifier or a signal obtained by branching the output signal of the amplifier into the first signal path by the splitter;
a second output terminal outputting the output signal of the amplifier or a signal obtained by branching the output signal of the amplifier into the second signal path by the splitter;
an output controller switching whether the output signal of the amplifier is output from the first output terminal, is output from the second output terminal, or is branched by the splitter to be output from both the first and second output terminals; and
an SOI (Silicon On Insulator) substrate having the amplifier, the splitter, and the output controller placed thereon, wherein
the splitter comprises:
a first inductor and a second inductor connected in series on the first signal path; and
a third inductor and a fourth inductor connected in series on the second signal path, and
the first to fourth inductors are spiral conductive patters arranged on the SOI substrate, wherein
the amplifier comprises:
a first amplifier amplifying a first input signal; and
a second amplifier amplifying a second input signal,
the splitter comprises:
a first variable capacitor having one end connected between the first inductor and the second inductor and another end connected to a third reference potential; and
a second variable capacitor having one end connected between the third inductor and the fourth inductor and another end connected to a fourth reference potential, and
the output controller
switches whether an output signal of the first amplifier is output from the first output terminal, is output from the second output terminal, or is branched by the splitter to be output from both the first and second output terminals, and switches whether an output signal of the second amplifier is output from the first output terminal, is output from the second output terminal, or is branched by the splitter to be output from both the first and second output terminals, and
switches a capacitance of the first and second variable capacitors to different values between when the output signal of the first amplifier is branched by the splitter and output and when the output signal of the second amplifier is branched by the splitter and output.

13. The device of claim 6, wherein
the amplifier comprises:
a first amplifier amplifying a first input signal; and
a second amplifier amplifying a second input signal,
the splitter comprises:
a first variable capacitor having one end connected between the first inductor and the second inductor and another end connected to a third reference potential; and
a second variable capacitor having one end connected between the third inductor and the fourth inductor and another end connected to a fourth reference potential,
the output controller
switches whether an output signal of the first amplifier is output from the first output terminal, is output from the second output terminal, or is branched by the splitter to be output from both the first and second output terminals, and switches whether an output signal of the second amplifier is output from the first output terminal, is output from the second output terminal, or is branched by the splitter to be output from both the first and second output terminals, switches a capacitance of the first and second variable capacitors to different values between when the output signal of the first amplifier is branched by the splitter and output and when the output signal of the second amplifier is branched by the splitter and output, a bias voltage is input to a gate of the first transistor, and a value of the bias voltage input to the gate of the first transistor and a value of a bias voltage input to a gate of the second transistor are larger when the output signal of the first amplifier or the second amplifier is branched by the splitter to be output from both the first and second output terminals than when the output signal of the first amplifier or the second amplifier is output from either the first or second output terminal.

14. The device of claim 12, wherein the amplifier comprises a gain adjustment circuit adjusting gain at a time of outputting an output signal of the first amplifier or the second amplifier from either the first or second output terminal to a value smaller than that of gain at a time of branching the output signal of the first amplifier or the second amplifier by the splitter to be output from both the first and second output terminals.

15. The device of claim 13, wherein the amplifier comprises a gain adjustment circuit adjusting gain at a time of outputting an output signal of the first amplifier or the second amplifier from either the first or second output terminal to a value smaller than that of gain at a time of branching the output signal of the first amplifier or the second amplifier by the splitter to be output from both the first and second output terminals.

16. A semiconductor device comprising:
an amplifier amplifying an input signal;
a splitter branching an output signal of the amplifier into a first signal path and a second signal path and performing impedance conversion of the first and second signal paths;
a first output terminal outputting the output signal of the amplifier or a signal obtained by branching the output signal of the amplifier into the first signal path by the splitter;
a second output terminal outputting the output signal of the amplifier or a signal obtained by branching the output signal of the amplifier into the second signal path by the splitter;
an output controller switching whether the output signal of the amplifier is output from the first output terminal, is output from the second output terminal, or is branched by the splitter to be output from both the first and second output terminals; and
an SOI (Silicon On Insulator) substrate having the amplifier, the splitter, and the output controller placed thereon, wherein
the splitter comprises:
a first inductor and a second inductor connected in series on the first signal path; and
a third inductor and a fourth inductor connected in series on the second signal path, and
the first to fourth inductors are spiral conductive patters arranged on the SOI substrate, wherein
the splitter comprises:
a first resistor connected between a first output node of the splitter on a side of the first signal path and a second output node of the splitter on a side of the second signal path; and
a second resistor and a capacitor connected in series between the first output node and the second output node.

* * * * *